US006455900B2

(12) United States Patent
Susami

(10) Patent No.: US 6,455,900 B2
(45) Date of Patent: Sep. 24, 2002

(54) SEMICONDUCTOR DEVICE

(75) Inventor: Takayuki Susami, Tokyo (JP)

(73) Assignee: NEC Corporation, Tokyo (JP)

( * ) Notice: Subject to any disclaimer, the term of this patent is extended or adjusted under 35 U.S.C. 154(b) by 22 days.

(21) Appl. No.: 09/783,107

(22) Filed: Feb. 14, 2001

(30) Foreign Application Priority Data

Feb. 18, 2000 (JP) ........................................ 2000-041282

(51) Int. Cl.⁷ ................................................ H01L 29/76
(52) U.S. Cl. ........................................ 257/369; 257/413
(58) Field of Search ................................ 257/369, 413, 257/48, 755

(56) References Cited

FOREIGN PATENT DOCUMENTS

| JP | 08250565 | 9/1976 |
|---|---|---|
| JP | 11145231 | 5/1999 |

*Primary Examiner*—Mark V. Prenty

(57) ABSTRACT

A semiconductor device of the present invention comprising an n-channel MOS transistor 1 and a p-channel MOS transistor 2 each having a salicide structure, and a high-melting point metal silicide film missing part detection element 3 detecting a missing part 128 formed in a high-melting point metal silicide film 126A provided on a gate electrode 106a, 106b of the MOS transistors 1,2, wherein the high-melting point metal silicide film missing part detection element 3 comprising a polysilicon film pattern 110 with alternate connection between an n-type region 116ab having a prescribed impurity concentration and a p-type region 116ba having a prescribed impurity concentration, and a high-melting point metal silicide film 126A formed on the polysilicon film pattern 110.

10 Claims, 17 Drawing Sheets

Fig. 1 3(a)
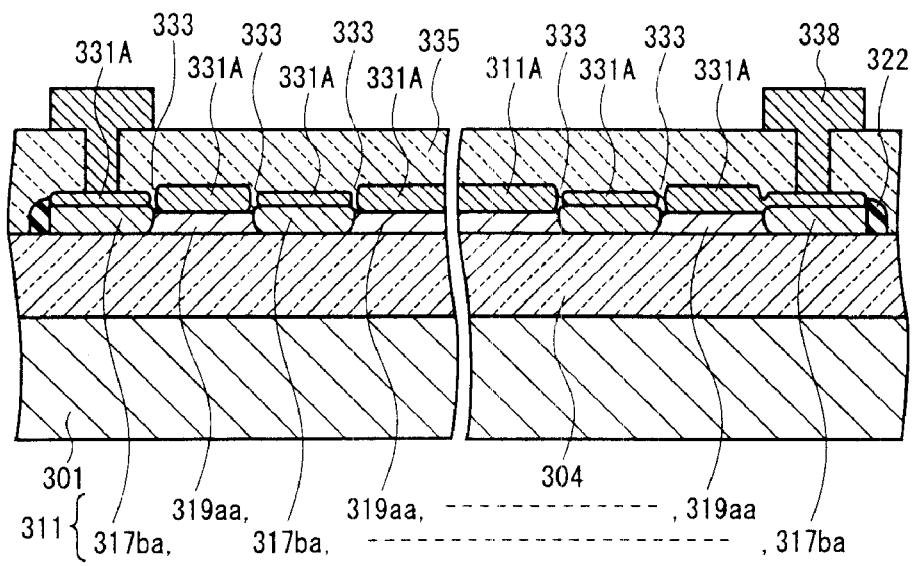
Fig. 1 3(b)
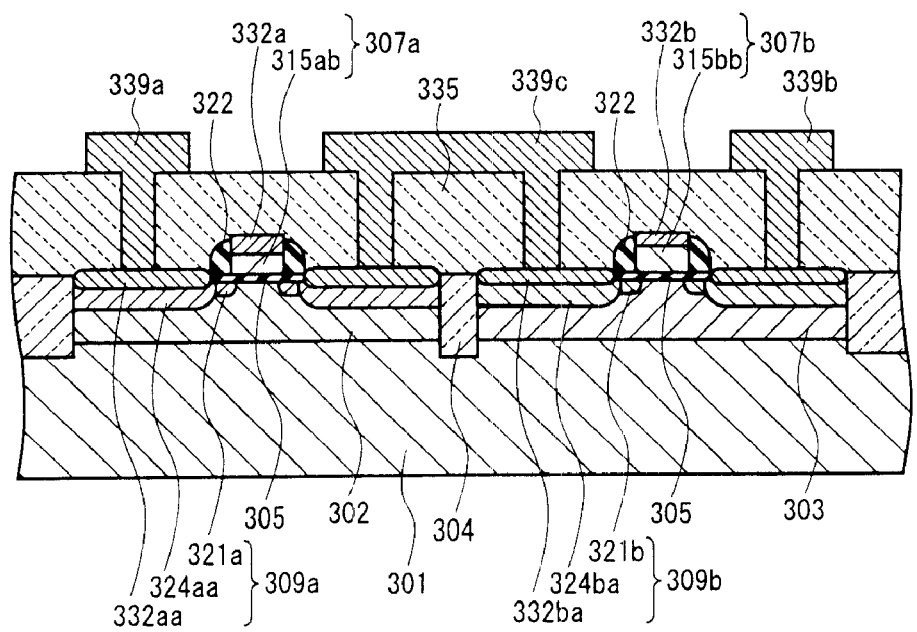

SEMICONDUCTOR DEVICE

FIELD OF THE INVENTION

The present invention relates to a semiconductor device that includes a CMOS transistor having a salicide structure, and more particularly it relates to a semiconductor device having a means for detecting a missing part in a high-melting-point metal silicide film in the connection part between an n-channel MOS transistor gate electrode and a p-channel MOS transistor gate electrode.

RELATED ART

In recent years, with shrinking of the design rule for MOS transistors, because it has become essential to reduce the parasitic resistance associated with the gate electrode, MOS transistors having a salicide structure have come into focus. In these MOS transistors having a salicide structure, with advancements in the shrinking of the design rule, it has become difficult to form a high-melting-point silicide layer in a self-aligning manner on a polysilicon film pattern which serves as the gate electrode, and on a diffusion layer which serves as a source/drain region, and particularly, missing parts occur in the high-melting-point silicide film pattern and high-melting-point metal silicide layer.

A detection means for detecting such missing parts is one in which a detection element formed by a $n^+$-type polysilicon film pattern of sufficient length or $p^+$-type polysilicon film pattern and a high-melting-point metal silicide film pattern formed in self-aligning manner thereover so as to form a polycide interconnect pattern, or a detection element formed by a $n^+$-type diffusion layer or $p^+$-type diffusion layer of sufficient length over which a high-melting-point silicide layer is formed in self-aligning manner is used, the resistance of either of these detection elements being measured to perform detection of missing parts. If there is no missing part in the high-melting-point metal silicide film pattern or the high-melting-point metal silicide layer, the above-noted resistance value is a low value. For example, in the case in which there is a macro-level missing part having a length on the order of micron in the high-melting-point metal silicide film pattern or high-melting-point metal silicide layer, the above-noted resistance value is high.

For example, in the case of a CMOS transistor having a salicide structure, the inverter gate electrode is as follows. In the element-separation regions of both transistors, an $n^+$-type polysilicon film pattern (forming an n-channel MOS transistor gate electrode) and a $p^+$-type polysilicon film pattern (forming the p-channel MOS transistor gate electrode) are directly connected, and a high-melting-point metal silicide film pattern is formed in self-aligning manner over these polysilicon film patterns, so as to constitute a gate electrode of the inverter. A missing part in the high-melting-point metal silicide film pattern on the inverter gate electrode tends to occur at the joining point between the $n^+$-type polysilicon film pattern and the $p^+$-type polysilicon film pattern, and the length of this missing part is in the order of no more than sub-micron size. When this type of missing part occurs on this $p^+$-$n^+$ junction, because the existence of this $p^+$-$n^+$ junction causes an increase in resistance, thereby causes an increase in the inverter gate delay time.

However, in detecting a missing part in a high melting point metal silicide film using a detection element such as described above, because there is only a small increase in resistance value caused by the existence of a missing part having a length in the sub-micron order, this approach to detecting a missing part at the junction of a $n^+$-type polysilicon film pattern and a $p^+$-type polysilicon film pattern formed on the gate electrode of the inverter is not suitable.

Accordingly, it is an object of the present invention to provide a semiconductor device, which includes a high-melting-point metal silicide film missing part detection element capable of detecting a minute missing part in a high-melting-point metal silicide film of a polycide interconnect in a semiconductor device including a CMOS transistor of salicide structure.

SUMMARY OF THE INVENTION

In order to achieve the above-noted object, the present invention adopts the following basic technical constitution.

The first aspect of the present invention is a semiconductor device comprising an n-channel MOS transistor 1 and a p-channel MOS transistor 2 each having a salicide structure, and a high-melting point metal silicide film missing part detection element 3 detecting a missing part 128 formed in a high-melting point metal silicide film 126A provided on a gate electrode 106a, 106b of the MOS transistors 1,2, wherein the high-melting point metal silicide film missing part detection element 3 comprising a polysilicon film pattern 110 with alternate connection between an n-type region 116*ab* having a prescribed impurity concentration and a p-type region 116*ba* having a prescribed impurity concentration, and a high-melting point metal silicide film 126A formed on the polysilicon film pattern 110.

In the second aspect of the present invention, the impurity concentration of the p-type region is higher than that of the n-type region.

In the third aspect of the present invention, both ends of the polysilicon film pattern are made of the p-type region.

In the fourth aspect of the present invention, the impurity concentration of the n-type region is higher than that of the p-type region.

In the fifth aspect of the present invention, both ends of the polysilicon film pattern are made of the n-type region.

In the sixth aspect of the present invention, a source/drain region of the MOS transistor is formed by a LDD region and a source/drain diffusion layer having an impurity concentration higher than that of the LDD region, an impurity concentration of n-type region of the high-melting point metal silicide film missing part detection element is equal to that of the source/drain diffusion layer of the n-channel MOS transistor, and an impurity concentration of p-type region of the high-melting point metal silicide film missing part detection element is equal to that of the source/drain diffusion layer of the p-channel MOS transistor.

In the seventh aspect of the present invention, a source/drain region of the MOS transistor is formed by a LDD region and a source/drain diffusion layer having an impurity concentration higher than that of the LDD region, an impurity concentration of n-type region of the high-melting point metal silicide film missing part detection element is equal to that of the LDD region of the n-channel MOS transistor.

In the eighth aspect of the present invention, a source/drain region of the MOS transistor is formed by a LDD region and a source/drain diffusion layer having an impurity concentration higher than that of the LDD region, an impurity concentration of p-type region of the high-melting point metal silicide film missing part detection element is equal to that of the LDD region of the p-channel MOS transistor.

In the ninth aspect of the present invention, minimum line width of the polysilicon film pattern of the high-melting point metal silicide film missing part detection element is equal to a gate length of a gate electrode of the MOS transistor.

In the tenth aspect of the present invention, the high-melting point metal is either one of titanium or cobalt.

BRIEF DESCRIPTION OF THE DRAWINGS

FIG. 13(a) is a schematic cross-sectional view showing a high-melting point metal silicide film missing part detection element according to the fourth embodiment of the present invention.

FIG. 13(b) is a schematic cross-sectional view showing a CMOS transistor having a salicide structure according to the fourth embodiment of the present invention.

DETAILED DESCRIPTION OF THE PREFERRED EMBODIMENTS

Figure 1A:
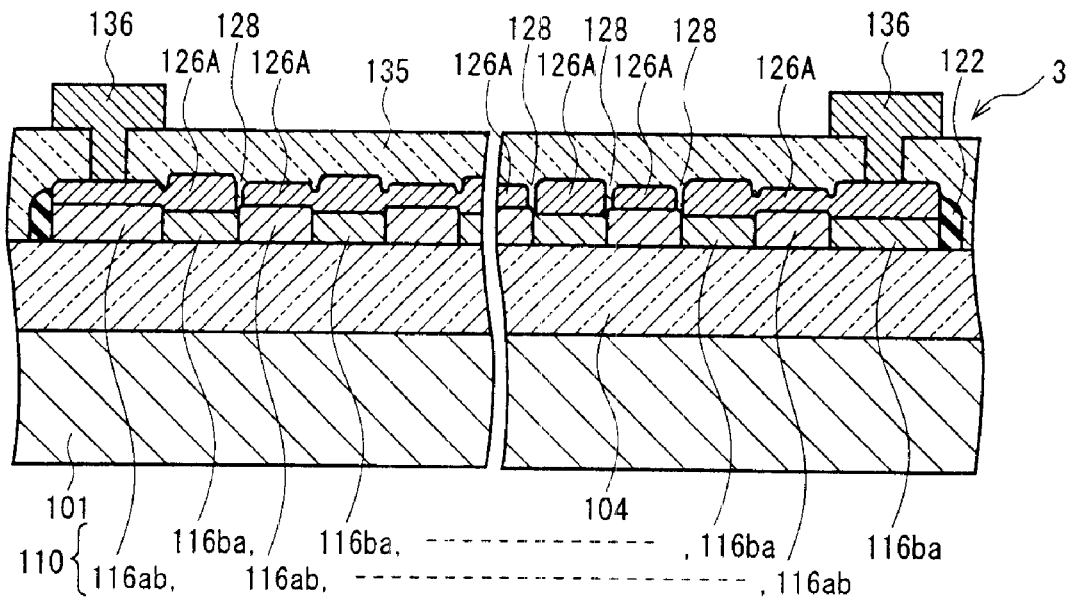
FIG. 1(a) is a schematic cross-sectional view showing a high-melting point metal silicide film missing part detection element according to the first embodiment of the present invention.

Preferred embodiments of the present invention are described in detailed below, with references made to relevant accompanying drawings.

First Embodiment

Specifically, the configuration of a semiconductor device according to a first embodiment of the present invention will be described with reference to FIG. 1(b), which is a schematic cross-sectional view of a CMOS transistor having a salicide structure, and FIG. 1(a), which is a schematic cross-sectional view of a high-melting-point metal silicide film missing part detection element.

Onto the surface of a silicon substrate 101, a p-type well 102 and n-type well 103, and a field insulation film 104 are provided. An element-separation region provided on the surface of the silicon substrate 101 is, for example, formed with an STI structure, in which a shallow groove is filled with the field insulation film 104. The p-type well 102 and n-type well 103 are separated by this field insulation film 104. An n-channel MOS transistor is provided on the surface of the p-type well 102, and a p-channel MOS transistor is provided on the surface of the n-type well 103, the above-noted high-melting-point metal silicide film missing part detection element being provided on the surface of the field insulation film 104, for example. The n-channel MOS transistor and p-channel MOS transistor, and the high-melting-point metal silicide film missing part detection element are covered by an interlayer insulation film 135.

The n-channel MOS transistor 1 is formed by a gate oxide film 105, a gate electrode 106a provided on the surface of the p-type well 102 via the gate oxide film 105, and a source/drain region 108a provided on the surface of the p-type well 102. The side surface of the gate electrode 106a is directly covered by an insulating film spacer 122. The source/drain region 108a is formed by an n-type source/drain extension diffusion layer (Lightly Doped Drain, LDD) 120 provided on the surface of the p-type well 102, self-aligned to the gate electrode 106a, an n$^+$-type source/drain diffusion layer 123aa provided on the surface of the p-type well 102, self-aligned to the gate electrode 106a and the insulation film spacer 122, and a titanium silicide ($TiSi_2$)

layer 127aa provided on the surface of the n$^+$-type source/drain diffusion layer 123aa, self-aligned to the gate electrode 106a and insulation film spacer 122. The gate electrode 106a directly covers the surface of the gate oxide film 105, and is formed by a laminate film comprising an n$^+$-type polysilicon film pattern 113ab extending over the surface of the field insulation film 104 and a titanium silicide film pattern 127a formed in self-aligning manner over the surface of the n$^+$-type polysilicon film pattern 113ab.

The minimum line width of the gate electrode 106a is, for example, 0.2 μm to 0.35 μm, and the film thickness of the titanium silicide film 127a and titanium silicide film 127aa is approximately 270 nm to 450 nm, the depth of the junction of the n$^+$-type source/drain diffusion layer 123aa being, for example, approximately 0.15 μm. The n-type source/drain extension diffusion layer 120a is formed by ion implantation of arsenic (As) on the order of $10^{14}$ cm$^{-2}$, the n$^+$-type source/drain diffusion layer 123aa is formed by ion implantation of arsenic at approximately $2 \times 10^{15}$ cm$^{-2}$. The insulation film spacer 122 is, for example, a silicon oxide film having a film thickness of approximately 50 nm or a silicon nitrate film of this thickness. The film thickness of the gate oxide film 105 is, for example, approximately 5 nm to 6 nm.

The p-channel MOS transistor 2 is formed by a gate oxide film 105, a gate electrode 106b provided on the surface of the n-type well 103, via the gate oxide film 105, and a source/drain region 108b provided on the surface of the n-type well 103. The side surface of the gate electrode 106b as well is directly covered by the insulation film spacer 122. The source/drain region 108b is formed by a p-type source/drain extension diffusion layer 120b provided on the surface of the n-type well 103, self-aligned to the p$^+$-type polysilicon film pattern 113bb, a p$^+$-type source/drain diffusion region 123ba provided on the surface of the n-type well 103, self-aligned to the gate electrode 106b and the insulation film spacer 122, and a titanium silicide layer 127ba formed on the surface of a p$^+$-type source/drain diffusion layer, self-aligned to the gate electrode 106b and insulation film spacer 122. The gate electrode 106b directly covers the surface of the gate oxide film 105, and is formed by a p$^+$-type polysilicon film pattern 113bb extending over the surface of the field insulation film 104 and a titanium silicide film pattern 127b provided self-aligned on the surface of the p$^+$-type polysilicon film pattern 113bb.

The minimum line width of the gate electrode 106b is the same as the minimum line width of the gate electrode 106a. The film thicknesses of the titanium silicide film 127b and titanium silicide layer 127ba are approximately 10% thicker than that of the titanium silicide film 127a and titanium silicide layer 127aa, this being for example 300 nm to 500 nm. The depth of the junction of the p$^+$-type source/drain diffusion layer 127ba is, for example, approximately 0.2 μm. The p-type source/drain extension diffusion layer 120b is formed by ion implantation of boron (B) or boron fluoride (BF$_2$) to a concentration on the order of $10^{14}$ cm$^{-2}$. The p$^+$-type source/drain diffusion layer 123ba is formed by ion implantation of boron at approximately $5 \times 10^{15}$ cm$^{-2}$, at an energy level of, for example, 2 keV.

Contact holes that reaches the source/drain regions 108a and 108b is provided in the interlayer insulation film 135. A metal interconnect connected to one side of the source/drain region 108a, a metal inter connect 137b connected to one side of the source/drain region 108b and a metal interconnect 137c that is connected to the other the source/drain region 108a and the other source/drain 108b are provided on the surface of the interlayer insulation film 135, via the contact holes. For example, the metal interconnect 137a is connected to the power supply voltage (VDD), and the metal interconnect 137b is connected to the ground voltage (GND).

Figure 1B:
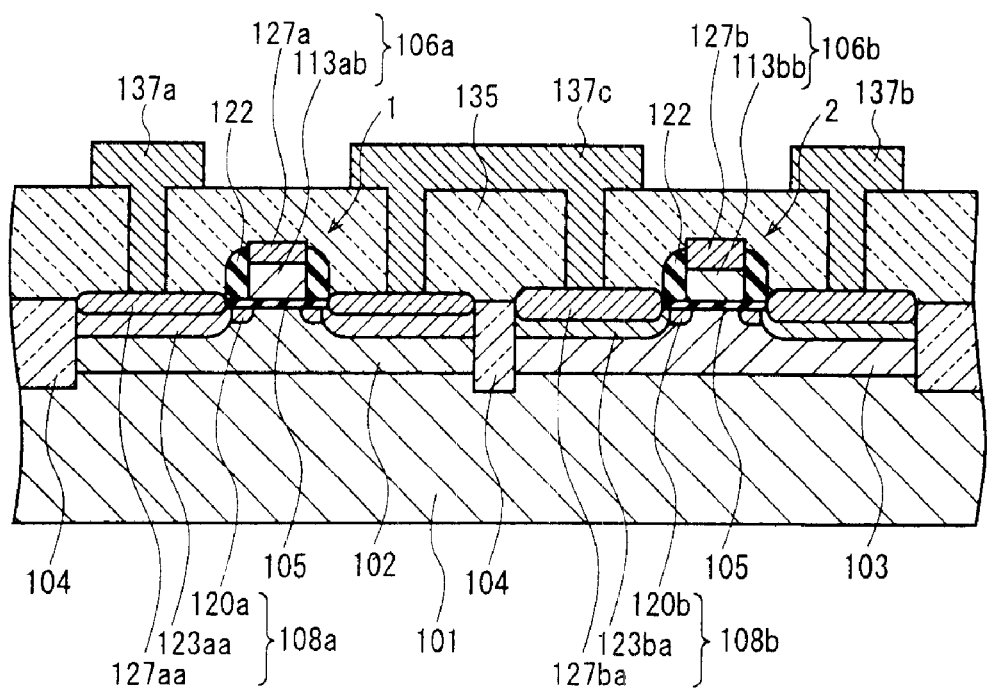
FIG. 1(b) is a schematic cross-sectional view showing a CMOS transistor having a salicide structure according to the first embodiment of the present invention.
Figure 2A:
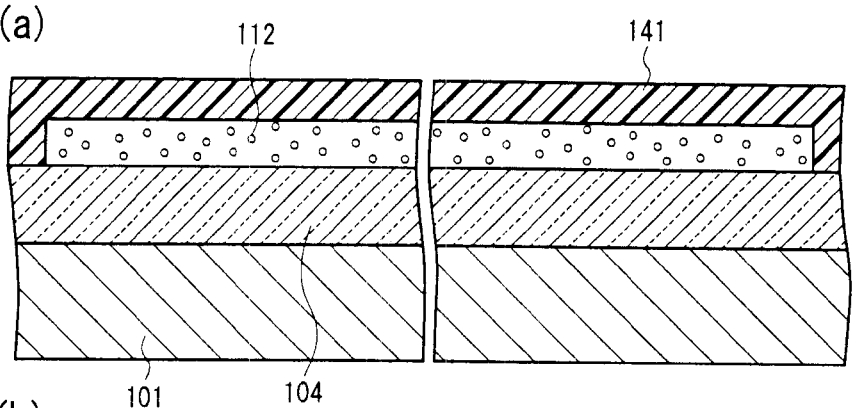
FIG. 2(a) to FIG. 2(d) are schematic cross-sectional views showing the manufacturing processes for a high-melting point metal silicide film missing part detection element according to the first embodiment of the present invention.
Figure 2B:
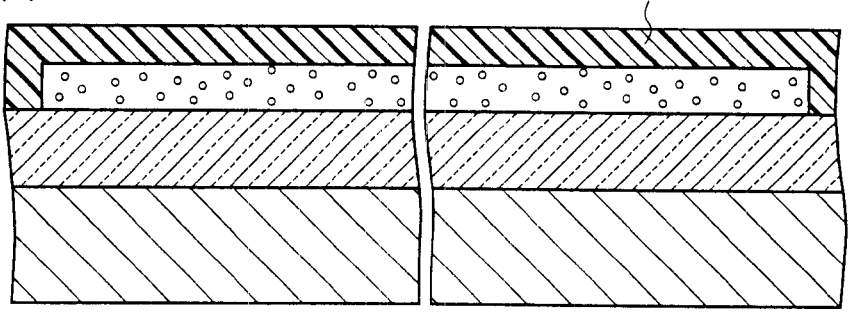
Figure 2C:
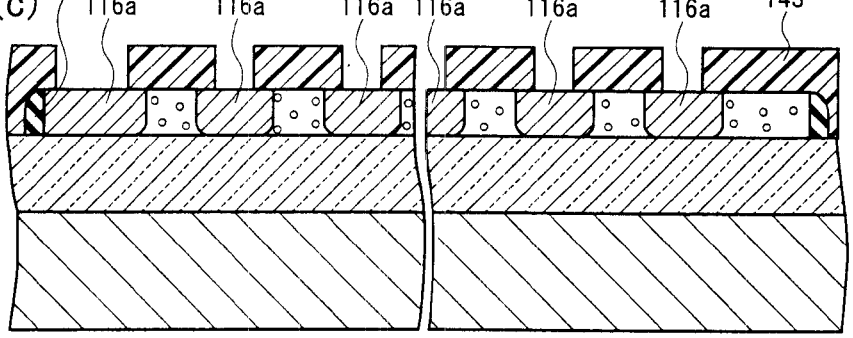
Figure 2D:
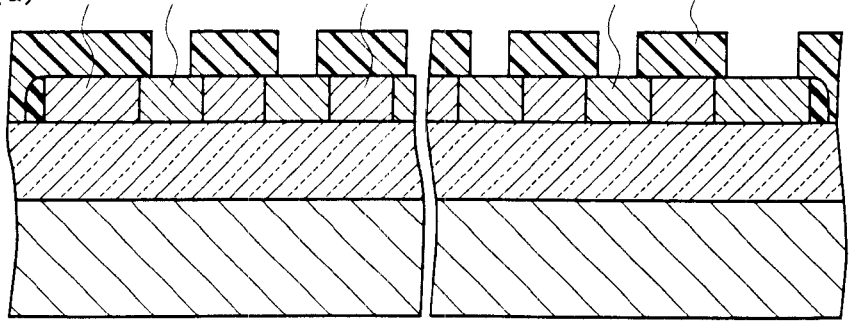

As shown in FIG. 1(a), the high-melting-point metal silicide film missing part detection element 3 is formed, for example, by a polysilicon film pattern 110 that directly covers the surface of the field insulation film 104, and a titanium silicide film pattern 126A provided on the surface of the polysilicon film pattern 110 in a self-aligning manner. The minimum line width of the high-melting-point metal silicide film missing part detection element is the same as the minimum line width the gate electrode 106a. The side surface of the high-melting-point metal silicide film missing part detection element is directly covered by the insulation film spacer 122. In this first embodiment of the present invention, the high-melting-point metal silicide film missing part detection element is not restricted to being provided on the surface of the field insulation film 104, and can alternately be provided, for example, so as to directly cover the surface of the gate oxide film 105.

The polysilicon film pattern 110 is formed by the mutual connection between an n$^+$-type region 116ab and the p$^+$-type type region 116ba. The lengths of the n$^+$-type type region 116ab and p$^+$-type region 116ba are each approximately 0.5 μm. The film thickness of the titanium silicide film pattern 126A is not uniform, and, in the part at the upper surface of the n$^+$-type region 116ab, and p$^+$-type region 116ba, it is the same as the film thicknesses of the titanium silicide film patterns 127a and 127b, respectively. Directly above the junction part between the n$^+$-type region 116ab and the p$^+$-type region 116ba, it is possible that a missing part 128 occurs in the titanium silicide film pattern 126A. The mechanism for the occurrence of the missing part 128 is described below.

A contact hole that reaches the two end parts of the high-melting-point metal silicide film missing part detection element is provided in the interlayer insulation film 135. A pair of metal interconnects 136 connected to each of the ends of the high-melting-point metal silicide film missing part detection element is provided on the surface of the interlayer insulation film 135, via these contact holes. For this reason, the line width at the two ends of the high-melting-point metal silicide film missing part detection element is wider than the minimum line width thereof (for example, approximately 0.5 μm. In the case in which at least one missing part 128 occurs in the titanium silicide film pattern 126A, if a bias is applied between the pairs of metal interconnects 136, and the resistance is measured, the resistance value measured will be a value that is sufficiently higher than the simple sheet resistance value. In the case in which it is necessary to detect the above-noted missing part 128 immediately before the formation of the interlayer insulation form 135, because it is necessary to make connection by a needle probe to these parts, the line width of the two ends of the high-melting-point metal silicide film missing part detection element is, for example, 20 μm or larger.

Specifically, in the first embodiment of the present invention, in a semiconductor device that includes a CMOS transistor having a salicide structure, a high-melting-point metal silicide film missing part detection element formed by the polysilicon film pattern 110 and the titanium silicide film pattern 126A is provided, so that it is easy to detect a minute missing part in the high-melting-point metal silicide film in the gate electrode made of polycide interconnect.

Referring to FIG. 2 and FIG. 3 which are schematic cross-sectional views of the process for manufacturing a high-melting-point metal silicide film missing part detection element, FIG. 4 and FIG. 5, which are schematic cross-sectional views showing the process for manufacturing a titanium salicide structured CMOS transistor, and the above-noted FIG. 1 are used below to further describe the first embodiment of a semiconductor device according to the present invention.

First, a p-type well 102, an n-type well 103, and a field insulation film 104 formed by a silicon oxide insulation film are formed on the surface of a silicon substrate 101. This field insulation film 104 provides element separation between the p-type well 102 and the n-type well 103. This field insulation film 104 is formed, for example, by filling a shallow groove, so as to form an element separation region having an STI structure on the surface on the silicon substrate 101. A gate oxide film 105 having a film thickness of, for example, 5 nm to 6 nm is formed by thermal oxidation on the surface of the p-type well 102 and n-type well 103.

Next, using, for example, an LPCVD process, an undoped polysilicon film (not shown in the drawing) having a film thickness of 150 nm to 200 nm is formed over the entire surface of the substrate. This undoped polysilicon film is patterned, and the undoped polysilicon film pattern 112 of the high-melting-point metal silicide film missing part detection element is formed on the surface of the field insulation film 104. Simultaneously, the undoped polysilicon film pattern 113 for the gate electrode on the gate electrode oxide 105 is formed, for example, extending from the surface of the p-type well 102, via the surface of the field insulation film 104, to the surface of the n-type well 103. The minimum line width of the undoped polysilicon film pattern 112 is the same as the minimum line width (gate length) of the undoped polysilicon film pattern 113, this being, for example, 0.2 $\mu$m to 0.35 $\mu$m. The line width of both ends of the undoped polysilicon film pattern 112 is made wider than this minimum line width, and is approximately, for example, 0.5 $\mu$m, and can be made 20 $\mu$m or greater, if necessary.

Next, a first photoresist film pattern 141 having an aperture at the part corresponding to the p-type well 102 and covering the undoped polysilicon pattern 112 the surface of the n-type well 103 is formed. This photoresist film pattern 141 is used as a mask to perform ion implantation of arsenic to the order of $10^{14}$ cm$^{-2}$, thereby part of the undoped polysilicon film pattern 113 becomes an n-type polysilicon film pattern 113a and simultaneously an n-type source/drain extension diffusion layer 120a self-aligned to the n-type polysilicon film pattern 113a, is formed on the surface of the p-type well 102. (refer to FIG. 2(a) and FIG. 4(a)).

After removing the above-noted photoresist film pattern 141, a second photoresist film pattern 142 is formed. This photoresist film pattern 142 is formed so as to have an aperture at a part corresponding to the n-type well 103 and so as to cover the undoped polysilicon film pattern 112 and the surface of the p-type well 102. This photoresist film pattern 142 is used as a mask to perform ion implantation of boron (or boron fluoride) to the order of $10^{14}$ cm$^{-2}$, so that the remaining part of the undoped polysilicon film pattern 113 becomes as a p-type polysilicon film pattern 113b, simultaneously with which a p-type source/drain extension diffusion layer 120b is formed on the surface of the n-type well 103, self-aligned to the p-type polysilicon film pattern 113b (refer to FIG. 2(b) and FIG. 4(b)).

It will be understood that in the first embodiment of the present invention there is no restriction with regard to the sequence of steps related to the photoresist film patterns 141 and 142, and that they can alternately be reversed from the sequence presented above. Additionally, if necessary, it is possible to perform ion implantation of a p-type impurity and n-type impurity, using the photoresist film pattern 141 and 142 so as to form, respectively, a p-type pocket diffusion layer and an n-type pocket diffusion layer on the surfaces of the p-type well 102 and the n-type well 103.

Next, the photoresist film pattern 142 is removed, and an LPCVD process is used to deposit an insulation film (silicon oxide or silicon nitride) having a film thickness of approximately 50 nm, for example, over the entire surface. This insulation film is etched back using anisotropic etching, so as to form an insulation spacer 122 on the side of the undoped polysilicon film pattern 112, the n-type polysilicon film pattern 113a, and the p-type polysilicon film pattern 113b, respectively.

Next, a third photoresist film pattern 143 is formed. The photoresist film pattern 143 has an aperture at a part corresponding to the p-type well 102 and minimally covers the surface of the n-type well 103. Additionally this photoresist film pattern 143 has a plurality of apertures at a part that covers the undoped polysilicon film pattern 112. The aperture width and spacing of the apertures in the part that covers the undoped polysilicon film pattern 112 (the part other than the end part of the undoped polysilicon film pattern 112) are each, for example, approximately 0.5 $\mu$m. This photoresist film pattern 143 is used as a mask, for example, to perform ion implantation of arsenic to approximately $2\times10^{15}$ cm$^{-2}$, 11 so that the n-type polysilicon film pattern 113a becomes an n$^+$-type polysilicon film pattern 113aa and so that an n$^+$-type source/drain diffusion region diffusion layer 123a is formed so as to be self-aligned with then$^+$-type polysilicon film pattern 113aa and insulation film spacer 122 on the surface on the p-type well 102. Simultaneously with this, an n$^+$-type region 116a is formed on the undoped polysilicon film pattern 112. The depth of the junction of the n$^+$-type source/drain diffusion layer 123a is, for example, approximately 0.15 $\mu$m and the length and spacing of the n$^+$-type region 116a, are under 0.6 $\mu$m and greater than 0.4 $\mu$m, respectively (refer to FIG. 2(c) and FIG. 4(c)).

Next, after removing the above-noted photoresist film pattern 143, a fourth photoresist film pattern 144 is formed. The photoresist film pattern 144 has an aperture at a part corresponding to the n-type well 103 and minimally covers the p-type well 102 surface. Additionally, this photoresist film pattern 144 is provided with a plurality of apertures in a part in which the undoped polysilicon film pattern 112 has not been doped to become an n$^+$-type region 116a. The aperture width and spacing in this part (the part other than the end part of the undoped polysilicon film pattern 112) are, for example, 0.5 $\mu$m. This photoresist film pattern 144 is used as a mask to perform ion implantation of boron to approximately $5\times10^{15}$ cm$^{-2}$ using an energy of, for example, 2 keV, so that the p-type polysilicon film pattern 113b becomes a p$^+$-type polysilicon film pattern 113ba, and a p$^+$-type source/drain diffusion layer 123b is formed on the surface of the n-type well 103, self-aligned to the p$^+$-type polysilicon film pattern 113ba and the insulation films spacer 122. Simultaneously with this, in the part of the undoped polysilicon film pattern 112 in which the n$^+$-type region 116a is not formed, a p$^+$-type region 116b is formed and the n$^+$-type region 116a becomes the n$^+$-type region 116aa. The depth of the junction the p$^+$-type source/drain diffusion layer 123b is, for example, approximately 0.2 $\mu$m, and the lengths of the n$^+$-type region 116aa and p$^+$-type region 116b, are each approximately, for example, 0.5 $\mu$m (refer to FIG. 2(d) and FIG. 4(d)). In the first embodiment, it will be understood that there is no restriction to the sequence of the processed steps related to the photoresist film patterns 143 and 144, and that they can alternately be reversed from the sequence presented above.

Figure 3A:
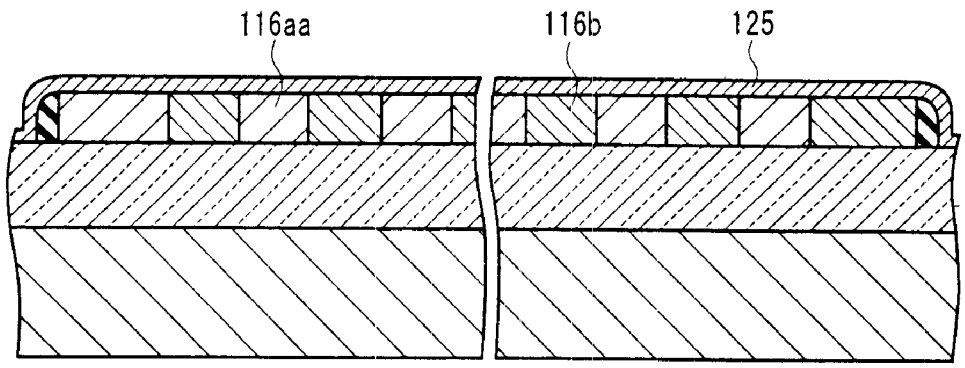
FIG. 3(a) to FIG. 3(c) are schematic cross-sectional views showing the manufacturing processes for a high-melting point metal silicide film missing part detection element according to the first embodiment of the present invention.
Figure 3B:
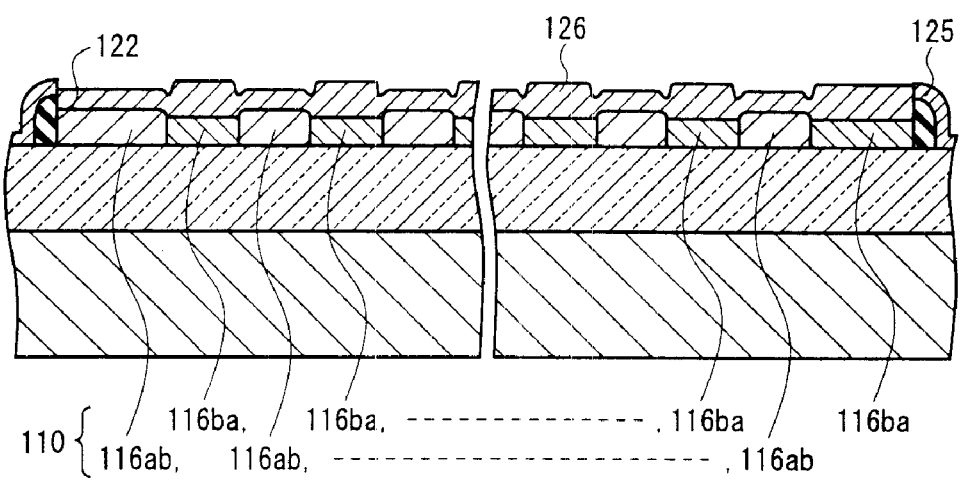
Figure 4:
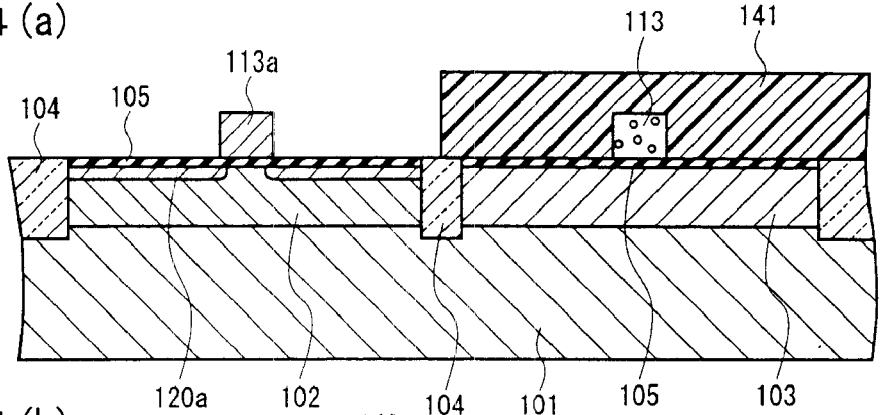
FIG. 4(a) to FIG. 4(d) are is schematic cross-sectional views showing the manufacturing processes for a CMOS transistor according to the first embodiment of the present invention.
Figure 4:
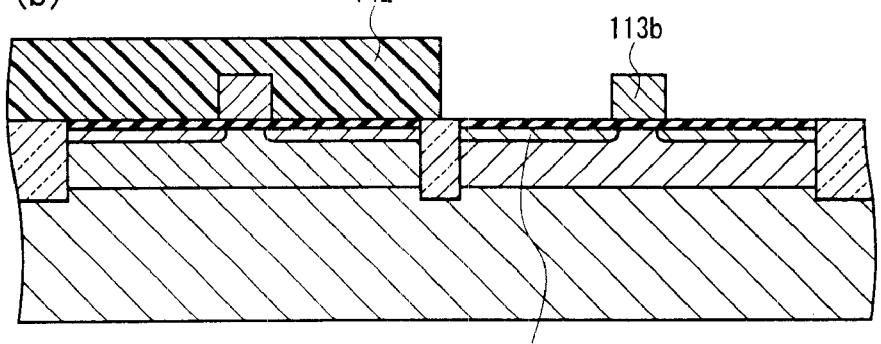
Figure 4:
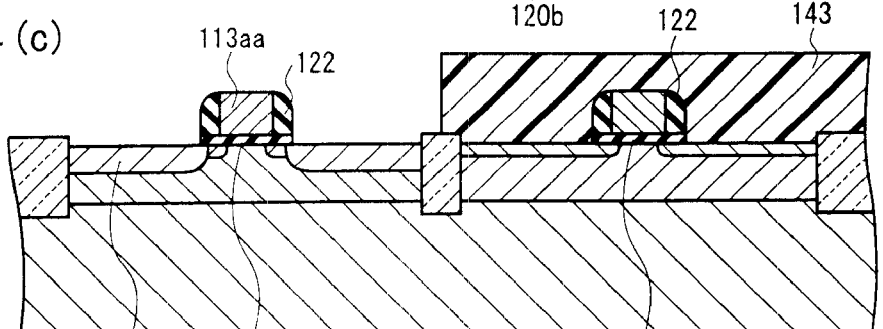
Figure 4:
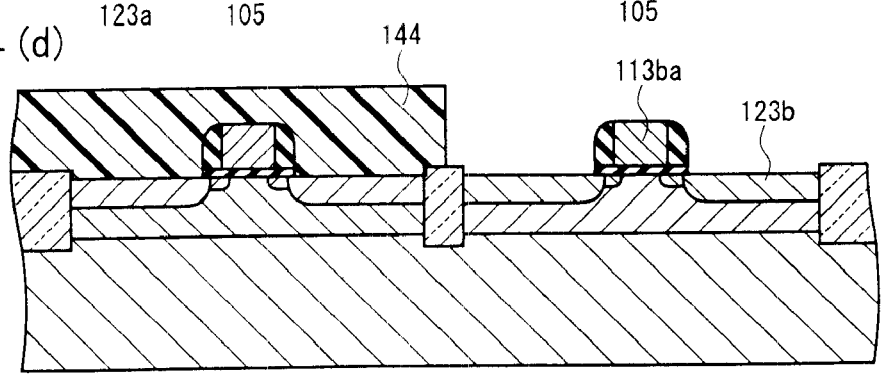
Figure 5A:
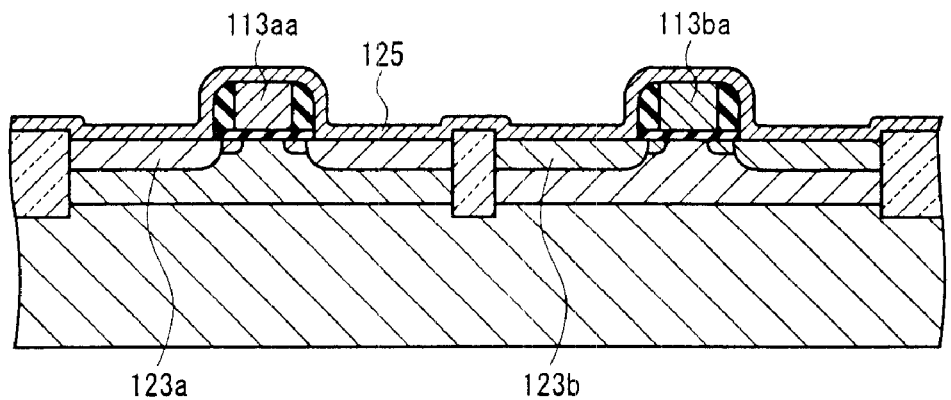
FIG. 5(a) to FIG. 5(c) are is schematic cross-sectional views showing the manufacturing processes for a CMOS transistor according to the first embodiment of the present invention.
Figure 5B:
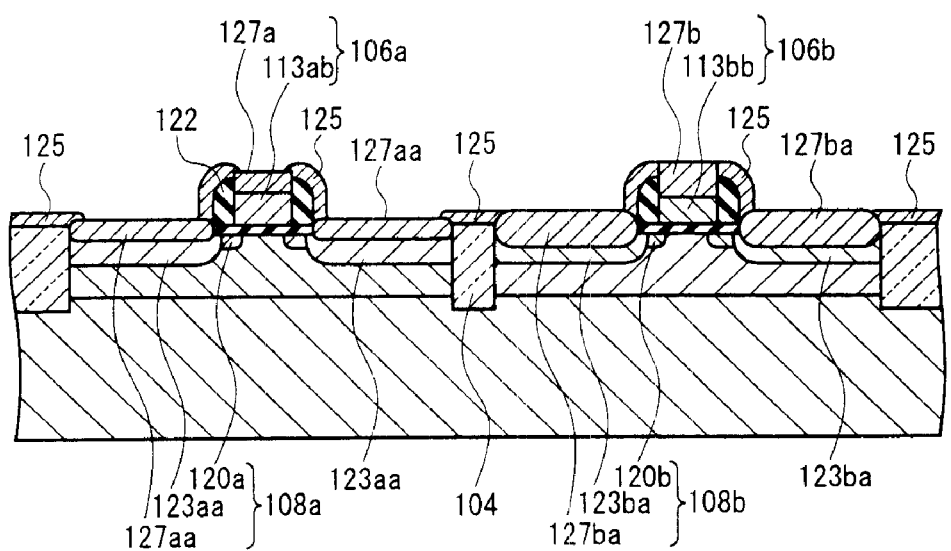

Next, after removing the photoresist film pattern 144, sputtering or the like is used to form a titanium film 125 over the entire surface area (refer to FIG. 3(a) and FIG. 5 (a)).

Next, a siliciding reaction is done at a prescribed reaction temperature. By doing this, in a part that forms a high-melting-point silicide film missing part detection element, the n$^+$-type region 116aa and p$^+$-type region 116b become the n$^+$-type region 116ab and p$^+$-type region 116ba, respectively, and the original undoped polysilicon film pattern 112 becomes a polysilicon film pattern 110 in which there is alternating connection between the n$^+$-type region 116ab and p$^+$-type 116ba, a titanium silicide film pattern 126 being formed in self-aligning manner on the surface of the polysilicon film pattern 110.

In the part that becomes the n-channel MOS transistor, the n$^+$-type polysilicon pattern 113aa becomes the n$^+$-type polysilicon film pattern 113ab, and a titanium silicide film pattern 127a is formed in self-aligning manner on the surface of the n$^+$-type polysilicon film pattern 113ab, a gate electrode 106a being formed from these laminated semiconductor films. Simultaneously, the n$^+$-type source/drain diffusion layer 123a becomes the n$^+$-type source/drain diffusion layer 123aa, and a titanium silicide layer 127aa is formed in self-aligning manner on the surface of the n$^+$-type source/drain diffusion layer 123aa, so that a source/drain region 108a being formed by the n$^+$-type source/drain extension diffusion region 120a, the n$^+$-type source/drain diffusion region 123aa, and the titanium silicide layer 127aa.

In a part that becomes the p-channel MOS transistor, the p$^+$-type polysilicon film pattern 113ba becomes the p$^+$-type polysilicon film pattern 113bb and a titanium silicide film pattern 127b is formed in self-aligning manner on the surface of the p$^+$-type polysilicon film pattern 113bb, a gate electrode 106b being formed from this laminated semiconductor film. Simultaneously, the p$^+$-type source/drain diffusion layer 123b becomes the p$^+$-type source/drain diffusion layer 123ba, and a titanium silicide layer 127ba is formed in self-aligning manner on the surface of the p$^+$-type source/drain diffusion layer 123ba, so that a source/drain diffusion region 108b being formed by the p-type source/drain extension diffusion layer 120b, the p$^+$-type source/drain diffusion layer 123ba, and the titanium silicide layer 127ba (refer to FIG. 3(b) and FIG. 5(b)).

In the titanium siliciding reaction, it is known that silicon diffuses into the titanium. When this occurs, if arsenic exists in a high concentration within the silicon, the speed of the siliciding reaction is reduced. As a result, the film thickness of the titanium silicide film pattern 126 in the part directly above the n$^+$-type region 116ab (and also the titanium silicide film 127a and titanium silicide layer 127aa) becomes smaller than (approximately 10%) the film thickness of the titanium silicide film pattern 126 directly above the p$^+$-type region 116ba (and the titanium silicide film 127b and the titanium silicide layer 127ba).

Figure 3C:
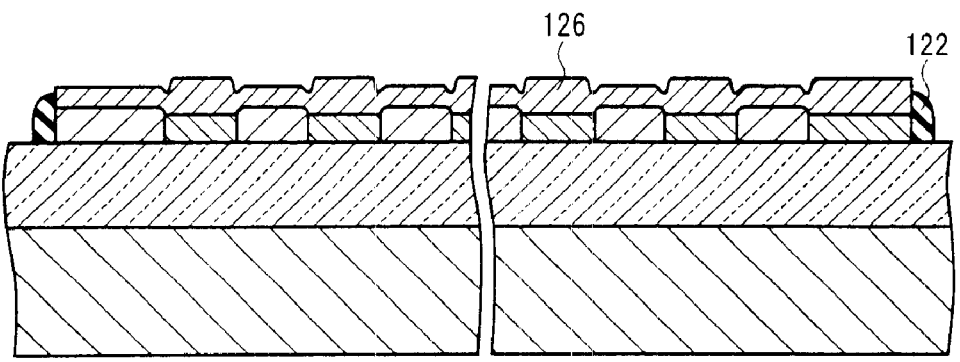
Figure 5C:
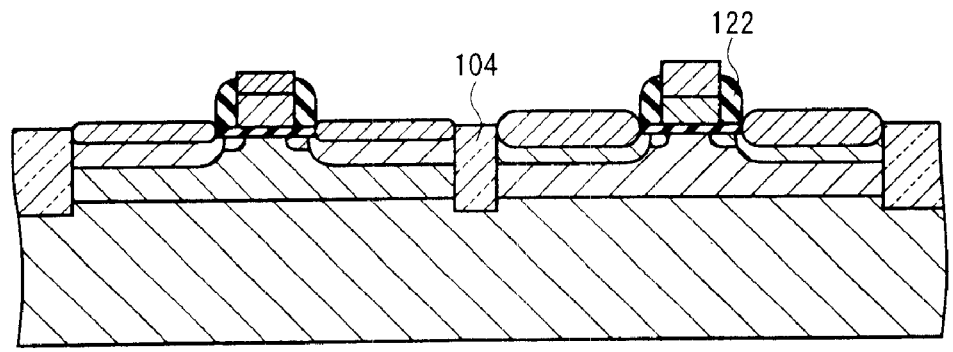

Next, the unreacted titanium layer 125 that directly covers the surface of the field insulation film 104 and insulation film spacer 122 is selectively removed (refer to FIG. 3(c) and FIG. 5(c)).

After the above is done, an interlayer insulation film 135 made of a silicon oxide insulation film is formed over the entire surface and a contact hole is formed in this interlayer insulation film 135. Additionally the metal interconnects 136, 137a, 137b, and 137c are formed on the surface of the interlayer insulation film 135, thereby completing the semiconductor device according to the first embodiment of the present invention.

During the manufacturing process including the above-noted siliciding reaction, and after completion of the semiconductor device, a missing part 128 in the titanium silicide film pattern 126 occurs at a position corresponding to a position directly above the joining part between the n$^+$-type region 116ab and p$^+$-type region 116ba in the polysilicon film pattern 110, so that the titanium silicide film pattern 126 becomes the titanium silicide film pattern 126A. The occurrence of the missing part 128 is due to the difference between the film thickness of the titanium silicide film pattern above the n$^+$-type region 116ab and the film thickness of the titanium silicide film pattern above the p$^+$-type region 116ba. Furthermore, in the case of titanium silicide, in the low-resistance phase C54 is used in the semiconductor element. For this reason, it is necessary to have a phase transition in the crystal structure from the high-resistance phase C49 to the low-resistance phase C54, and coagulation of the titanium silicide film occurred in the phase transition is also a cause of the tendency for the above-noted missing part 128 to occur.

Second Embodiment

Figure 6A:
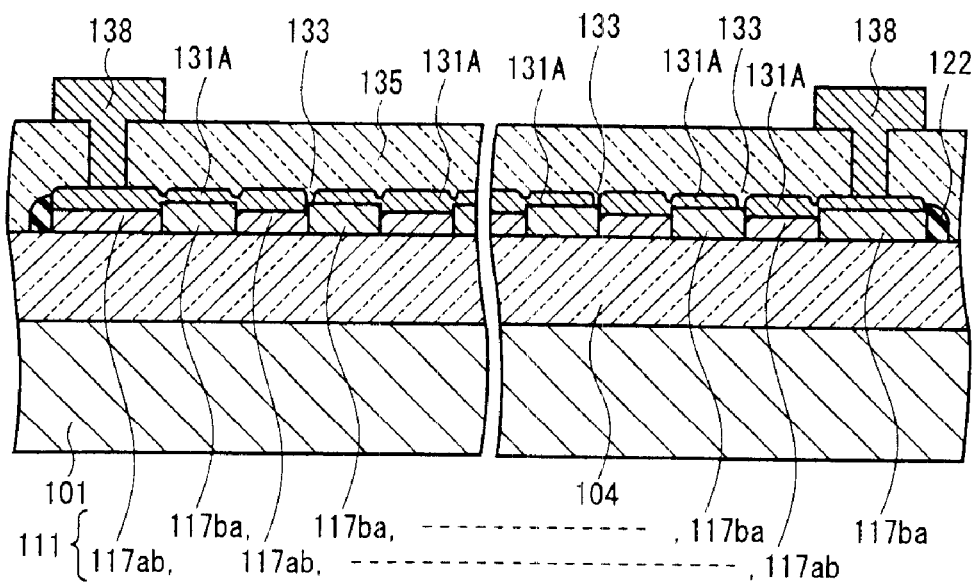
FIG. 6(a) is a schematic cross-sectional view showing a high-melting point metal silicide film missing part detection element according to the second embodiment of the present invention.

The second embodiment of the present invention will be described with reference to FIG. 6(b) which is a schematic cross-sectional view of a CMOS transistor having a salicide structure, and FIG. 6(a) which is a schematic cross-sectional view of a high-melting-point metal silicide film missing part detection element. The second embodiment differs from the first embodiment in that the semiconductor device according to the second embodiment includes a CMOS transistor having a cobalt salicide structure.

In the above-noted semiconductor device, a p-type well 102, and n-type well 103 and a field insulation film 104 are provided on the surface of a silicon substrate 101. An n-channel MOS transistor is provided on the surface of the p-type well 102 and a p-channel MOS transistor is provided on the surface on the n-channel well 103, the above-noted high-melting-point metal silicide film missing part detection element being provided on the surface, for example, of the field insulation film 104. The n-channel MOS transistor, p-channel MOS transistor and high-melting-point metal silicide film missing part detection element are covered by an interlayer insulation film 135.

The n-channel MOS transistor is formed by a gate oxide film 105, a gate electrode 107a provided on the surface of the p-type well 102 via the gate oxide film 105, and a source/drain region 109a provided on the surface of the p-type well 102. The side surface of the gate electrode 107a is directly covered by an insulation film spacer 122. The source/drain region 109a is formed by an n-type source/drain extension diffusion layer 121a provided on the surface of the p-type well 102, self-aligned to the gate electrode 107a, an n$^+$-type source/drain diffusion region 124aa provided on the surface of the p-type well 102, self-aligned to the gate electrode 107a and the insulation film spacer 122, and a cobalt silicide (CoSi$_2$) layer 132aa formed on a surface of the n$^+$-type source/drain diffusion layer 124aa, self-aligned to the gate electrode 107a and insulation film spacer 122. The gate electrode 107a directly covers the surface of the gate oxide film 105, and is formed by a laminate film made of an n$^+$-type polysilicon film pattern 115ab extending over the surface of the field insulation film 104 and a cobalt silicide film pattern 132a provided in self-aligned manner on the surface of the n$^+$-type polysilicon film pattern 115ab.

The minimum line width of the gate electrode 107a is, for example, 0.18 μm, and the film thickness of the cobalt silicide film 132a and cobalt silicide film 132aa is approximately 250 nm to 350 nm, the depth of the junction of the n$^+$-type source/drain diffusion region 124aa being, for example, 0.10 μm smaller. The n-type source/drain extension diffusion layer 121a is formed by ion implantation of arsenic in the order of $10^{14}$ cm$^{-2}$, and n$^+$-type source/drain diffusion layer 124aa is formed, for example, by ion implantation of arsenic in the order of 5×$10^{15}$ cm$^{-2}$. The insulation film spacer 122 is formed by a silicon oxide film or a silicon nitride film having a film thickness of, for example, approximately 50 nm. The gate oxide film 105 thickness is, for example, approximately 2.5 nm to 3.5 nm.

The p-channel MOS transistor is formed by the gate oxide film 105, the gate electrode 107b formed on the surface of the n-type well 103 via the gate oxide film 105, and a drain/source region 109b provided on the surface of the n-type well 103. The side surface of the gate electrode 107b as well is directly covered by the insulation film spacer 122. The source/drain region 109b is formed by a p-type source/drain extension diffusion layer 121b provided on the surface of the n-type well 103, self-aligned to the p$^+$-type polysilicon film pattern 115bb, a p$^+$-type source/drain diffusion layer 124ba provided on the surface of the n-type well 103, self-aligned to the gate electrode 107b and the insulation film spacer 122, and a cobalt silicide film 132ba formed on the surface of the p$^+$-type source/drain diffusion layer 124ba, self-aligned to the gate electrode 107b and the insulation film spacer 122. The gate electrode 107b directly covers the gate oxide film 105, and is formed by the p$^+$-type polysilicon film pattern 115bb extending over the surface of the field insulation film 104, and a cobalt silicide film pattern 132b provided in self-aligning manner on the surface of the p$^+$-type polysilicon pattern 115bb.

The minimum line width of the gate electrode 107b is the same as the minimum line width of the gate electrode 107a. The film thicknesses of the cobalt silicide film 132b and the cobalt silicide layer 132ba, different than the relationship between the titanium silicide thicknesses over the n$^+$ layer and p$^+$ layer in the first embodiment, are 5% thinner than the film thicknesses of the cobalt silicide film 132a and the cobalt silicide layer 132aa, this being for example approximately 240 nm to 330 nm. The thickness of the junction of the p$^+$-type source/drain diffusion layer 124ba is, for example, approximately 0.15 μm. The p-type source/drain extension diffusion layer 121b is formed by ion implantation of boron (B) or boron fluoride (BF$_2$) to the order of $10^{14}$ cm$^{-2}$. The p$^+$-type source/drain diffusion layer 124ba is formed by ion implantation of boron to approximately 2×$10^{15}$ cm$^{-2}$ to 3×$^{15}$ cm$^{-2}$, using an energy of 2 keV, for example.

A contact hole that reaches the source/drain regions 109a and 109b is provided in the interlayer insulation film 135. Withun these contact holes, a metal interconnect 139a connected to one side of the source/drain region 139a, a metal interconnect 139b connected to one side of the source/drain region 109b, and a metal interconnect 139c which is connected to the other source/drain region 109a and the other source/drain region 109b are provided. For example, the metal interconnect 139a is connected to the power supply voltage, and the metal interconnect 139b is connected to the ground voltage.

The high-melting-point metal silicide film missing part detection element is formed, for example, by a polysilicon film pattern 111 that directly covers the surface of the filled insulation film 104, and a cobalt film silicide pattern 131A provided in the self-aligned manner on the surface of the polysilicon pattern 111. The minimum line width of the high-melting-point metal silicide film missing part detection element is the same as the minimum line width of the gate electrode 107a. The side of the high-melting-point metal silicide film missing part detection element as well is covered directly by the insulation film spacer 122. In this second embodiment of the present invention as well, there is no restriction that the high-melting-point metal silicide film missing part detection element can be provided on the surface of the insulation film 104, and this can be alternately provided so as to directly cover the surface of the gate electrode film 105.

The polysilicon film pattern 111 is formed by an n$^+$-type region 117ab and a p$^+$-type region 117ba which are mutually connected. The lengths of the n$^+$-type region 117ab and the p$^+$-type region 117ba are, for example, approximately 0.5 μm, respectively. The film thickness of the cobalt silicide film pattern 131A as well is not uniform. The film thickness of the cobalt silicide film pattern 131A in parts above the n$^+$-type region 117ab is the same as the film thickness of the cobalt silicide film pattern 132a, and the film thickness of the cobalt silicide film pattern 131A in parts above the p$^+$-type region 117ba is the same as the film thickness of the cobalt silicide film pattern 132b. Directly above the junction part between the n$^+$-type region 117ab and the p$^+$-type region 117ba, it is possible for a missing part 133 to form in the cobalt silicide film pattern 131A.

A contact hole that reaches the two ends of the high-melting-point metal silicide film missing part detection element is provided in the interlayer insulation film 135. A pair of metal interconnects 138 connected to each of the ends of the high-melting-point metal silicide film missing part detection element is provided on the surface of the interlayer insulation film 135, within the contact holes. For this reason, the line widths at the two ends of the high-melting-point metal silicide film missing part detection element are wider than the minimum line widths thereof, this being, for example, approximately 0.5 μm. In the case in which it is necessary to detect the above-noted missing part 133 immediately before formation of the interlayer insulation film 135, the line width of both ends of the high-melting-point metal silicide film missing part detection element, because of the need to make connection to this part using a needle probe, is made, for example, 20 μm or larger.

The silicidation in the cobalt silicide, differing from the case of titanium silicide, is known to exhibit diffusion of cobalt within the silicon. The reason that the film thickness of the cobalt silicide film 132b and cobalt silicide layer 132ba is thinner than the film thickness of the cobalt silicide film 132a and the cobalt silicide layer 132aa is that because the ratio of occurrence of cobalt silicide seeds is greater in the n$^+$ layer silicon surface than in the p$^+$ layer silicon surface. The occurrence of a missing part 133 in the cobalt film silicide pattern 133A, similar to the case of a titanium silicide film pattern, is due to the existence of a difference between the film thickness of the cobalt silicide film pattern at the n$^+$ layer surface and the film thickness of the cobalt silicide film pattern at the p$^+$ layer surface. These missing parts 133, similar to the case of the first embodiment of the present invention, occur at the silicidation steps and thereafter, and further occur after the completion of the semiconductor device.

In the second embodiment of the present invention as well, similar to the first embodiment, in the case in which at least one missing part 133 occurs in the cobalt silicide film pattern 131A, if the resistance is measured by applying a bias between the pair of metal electrodes 138, a measured resistance value will be sufficiently larger than the simple sheet resistance value. Accordingly, by providing the above-noted high-melting-point metal silicide film missing part detection element formed by a polysilicon film pattern 111 and a cobalt silicide film pattern 131A in a semiconductor that includes a CMOS transistor having a salicide construction, it is possible to detect a minute missing part in a high-melting-point metal silicide film in a gate electrode made of a polycide interconnect.

A method for manufacturing the semiconductor device according to the second embodiment of the present invention is described below, making reference to FIG. 7, which is a cross-sectional viewshowing the major manufacturing process steps for a high-noting-point metal suicide film missing part detection element, and FIG. 6.

First, a p-type well 102, an n-type well 103, and a field insulation film 104 are formed on the surface of a silicon substrate 101, after that, a gate oxide film 105 having a thickness of 2.5 nm to 3.5 nm is formed by thermal oxidation processing.

Next, an undoped polysilicon film having a film thickness of 150 nm or so is formed over the entire surface, this undoped polysilicon film is patterned, and the undoped polysilicon film pattern for a high melting point silicide missing part detection element is formed on the surface of the field insulation film 104, for example. Simultaneously with this, by patterning an undoped polysilicon film, the gate electrodes for an n-channel MOS transistor and the p-channel MOS transistor are formed so as to extend from the surface of the p-type well 102 to the surface of the n-type well 103 passing through on the field insulation film 104. The minimum width of these undoped polysilicon film patterns is 0.18 $\mu$m. The line width at both ends of the undoped polysilicon film patterns for the high-melting-point metal silicide missing part detection element is made wider than this minimum width, for example, approximately 0.5 $\mu$m, and can be made 20 $\mu$m or greater, if necessary.

Figure 6B:
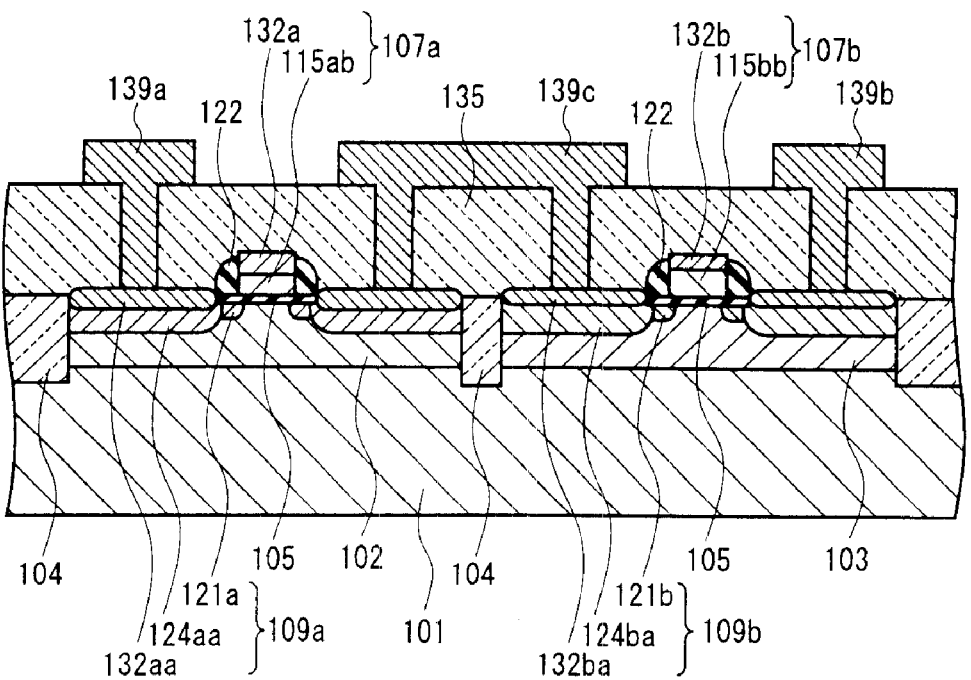
FIG. 6(b) is a schematic cross-sectional view showing a CMOS transistor having a salicide structure according to the second embodiment of the present invention.

Next, a first photoresist film pattern having the same shape as the first photoresist film pattern 141 described above is formed on the substrate 101, this first photoresist film pattern is used as a mask to implant arsenic ions in the order of $10^{14}$ cm$^{-2}$, thereby the undoped polysilicon film pattern in the part corresponding to the gate electrode of the n-channel MOS transistor becomes the n-type polysilicon film, simultaneously with which the n-type source/drain extension diffusion layer 121a self-aligned to the n-type polysilicon film is formed on the p-type well 102 (FIG. 6(b)).

After removal of the above-noted first photoresist film pattern, a second photoresist film pattern having the same shape as the first photoresist film pattern 142 is formed. This second photoresist film pattern is used as a mask to perform ion implantation of boron (or boron fluoride) to the order of $10^{14}$ cm$^{-2}$, the remaining part of the undoped polysilicon film pattern for the gate electrode becoming a p-type polysilicon film pattern, simultaneously with which a p-type source/drain extension diffusion layer 121b is formed on the n-type well 103, self-aligned with this p-type polysilicon film pattern (FIG. 6(b)).

In this second embodiment as well, there is no particular restriction with regard to the sequence of the steps related to the first and second photoresist film patterns, and it is possible to reverse this sequence. If necessary, the first and second photoresist film patterns can be used as a mask to perform ion implantation of a p-type impurity and an n-type impurity, so that a p-type pocket diffusion layer and an n-type pocket diffusion layer are formed on the surfaces of the p-type well 102 and the n-type well 103, respectively.

Next, after removing the above-noted second photoresist film pattern, an insulation film (silicon oxide film or silicon nitride film) 130 is formed over the entire surface, using a LPCVD process, this insulation film being then etched back using an anisotropic etching, so as to form an insulation spacer 122 on the side surfaces of the undoped polysilicon film pattern for the above-noted high-melting-point metal silicide film missing part detection element and the n-type and p-type polysilicon patterns (FIG. 6(b)).

Next, a third photoresist film pattern, having the same shape as the photoresist film pattern 143 in the first embodiment is formed. This third photoresist film pattern is used as a mask to perform ion implantation of arsenic to approximately 5×$10^{15}$ cm$^{-2}$, thereby the above-noted n-type polysilicon film pattern becoming an n$^+$-type polysilicon film pattern, and an n$^+$-type source/drain diffusion layer 123aa being formed on the p-type well 102 surface, self-aligned with the n$^+$-type polysilicon film pattern and insulation film spacer 122. Simultaneously with this, an n$^+$-type region 117ab is form on the undoped polysilicon film pattern for the above-noted high melting point metal silicide film missing part detection element. The depth of the junction of the n$^+$-type source/drain diffusion layer 124aa is, for example, 0.10 $\mu$m or less, and the length and the spacing of the n$^+$-type region are, for example, less than 0.6 $\mu$m and greater than 0.4 $\mu$m, respectively (FIG. 6(b)).

Next, after removing the above-noted third photoresist film pattern, a fourth photoresist film pattern, having the same shape as the photoresist film pattern 144 of the first embodiment, is formed. This fourth photoresist film pattern is used as a mask to perform ion implantation of boron to approximately 5×$10^{15}$ cm$^{-2}$, using an energy of 2 keV, for example, so that the above-noted p-type polysilicon film pattern becomes a p$^+$-type polysilicon film pattern and the p$^+$-type source/drain diffusion layer is formed on the surface of the n-type well 103, self-aligned to the p$^+$-type polysilicon film pattern and insulation film spacer 122. Simultaneously with this, in the part of the undoped polysilicon film pattern for the high-melting-point metal silicide film missing part detection element in which the above-noted n$^+$-type region is not formed, a p$^+$-type region 117b is formed, the above-noted n$^+$-type region becoming the n$^+$-type region 117aa. The depth of the junction of the p$^+$-type source/drain diffusion layer is, for example, 0.15 $\mu$m or so, and the lengths of the n$^+$-type region 117aa and p$^+$-type region 117b are each, for example, approximately 0.5 $\mu$m (FIG. 6(a), FIG. 7(a)).

In this second embodiment as well, there is no particular restriction with regard to the sequence of the steps related to the third and fourth photoresist film patterns, and this sequence can be reversed.

Figure 7A:
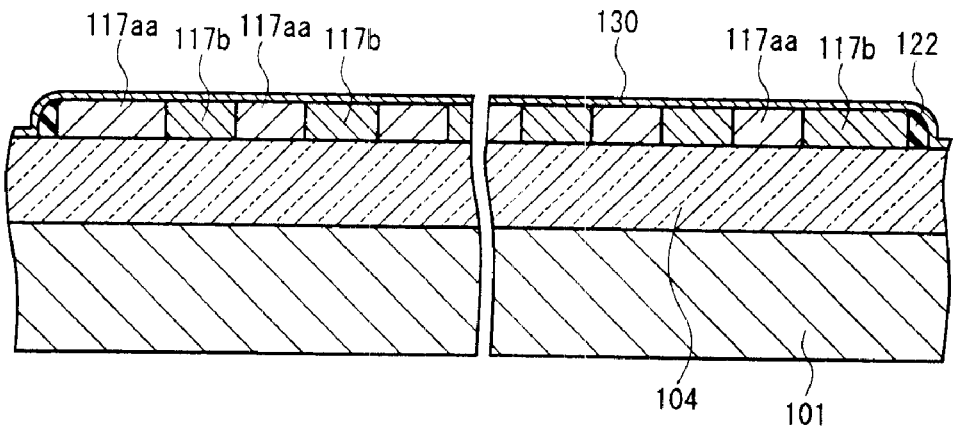
FIG. 7(a) to FIG. 7(c) are schematic cross-sectional views showing the manufacturing processes for a high-melting point metal silicide film missing part detection element according to the second embodiment of the present invention.
Figure 7B:
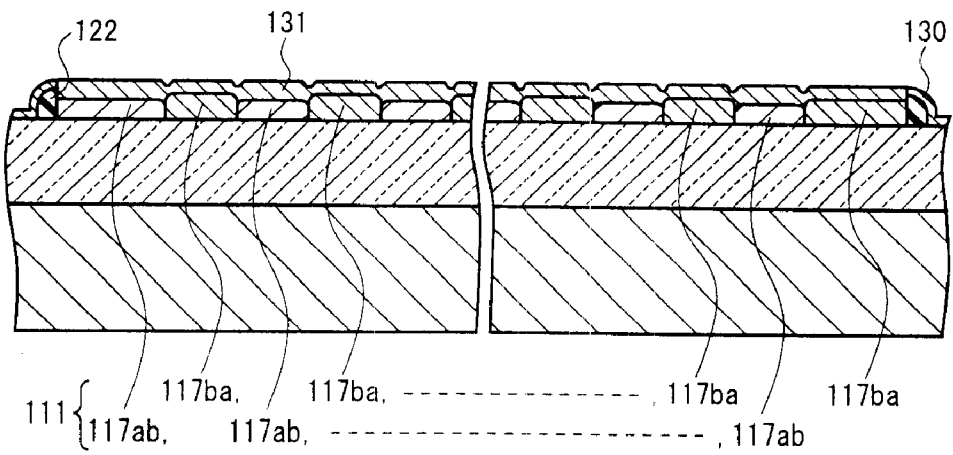

Next, after removing the above-noted fourth photoresist film pattern, a cobalt film 130 is formed over the entire surface, using, for example, sputtering (FIG. 7(a)).

Next, a siliciding reaction is caused at a temperature of, for example, 900° C. By doing this, in the part that becomes the high-melting-point metal silicide film missing part detection element, the n$^+$-type region 117aa and p$^+$-type region 117b become an n$^+$-type region 117ab and p$^+$-type region 117ba, respectively, the original undoped polysilicon film pattern for the high-melting-point-metal silicide film missing part detection element becoming a polysilicon film pattern in which there is alternating connection between the n⁺-type region 117ab and the p⁺-type region 117ba, a cobalt silicide film pattern 131 being formed on the surface of the polysilicon film pattern 111, in a self-aligned manner.

In the part that becomes the n-channel MOS transistor, the above-noted n⁺ type polysilicon film pattern becomes an n⁺-type polysilicon film pattern 115ab, and a cobalt silicide film pattern 132a is formed on the surface of the n⁺-type polysilicon film pattern 115ab, in self-aligned manner, thereby forming a gate electrode 107a by these laminated semiconductor layers. Simultaneously with this, the above-noted n⁺-type source/drain diffusion layer becomes an n⁺-type source/drain diffusion layer 124aa, and a cobalt silicide film 132aa is formed on the n⁺-type source/drain diffusion layer 124aa, in self-aligning manner, thereby forming a source/drain region 109a formed by an n-type source/drain extension diffusion layer 121a, an n⁺-type source/drain diffusion layer 124aa, and a cobalt silicide film 132aa.

In the part that becomes the p-channel MOS transistor, the above-noted p⁺-type polysilicon film pattern becomes a p⁺-type polysilicon film pattern 115bb and a cobalt silicide film pattern 132b is formed on the surface of the p⁺-type polysilicon film pattern 115bb in self-aligned manner, these laminated semiconductor films forming a gate electrode 107b. Simultaneously with this, the above-noted p⁺-type source/drain diffusion layer becomes a p⁺-type source/drain diffusion layer 124ba, and a cobalt silicide film 132ba is formed on the p⁺-type source/drain diffusion layer 124ba, in self-aligned manner, thereby forming a source/drain region 109b by the p-type source/drain extension diffusion layer 121b, the p⁺-type source/drain diffusion layer 124ba, and the cobalt silicide layer 132ba (FIG. 6(b)).

Figure 7C:
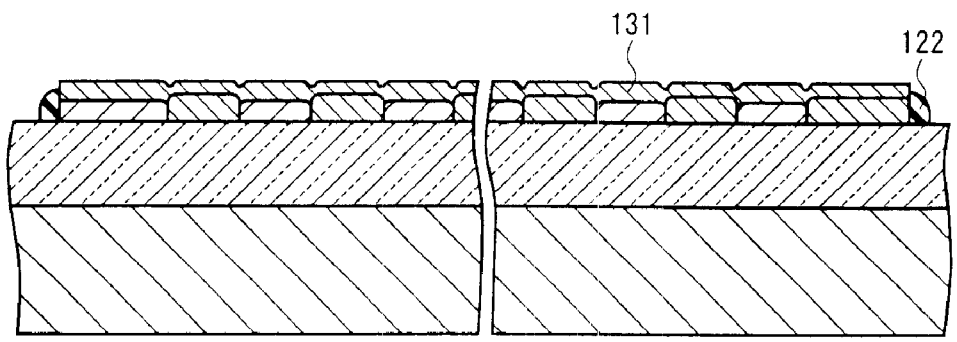

Next, an unreacted titanium film 130 that directly covers the surfaces of the field insulation film 104 and the insulation film spacer 122 is selectively removed (FIG. 7(c)).

After the above, an interlayer insulation film 135 formed by a silicon oxide insulation film is formed over the entire surface, and a contact hole is formed in this interlayer insulation film 135. Additionally, metal interconnects 138, 139a, 139b, and 139c are formed on the surface of the interlayer insulation film 135, thereby completing the semiconductor device of the second embodiment (FIG. 6).

Although the above-described first and second embodiments relate to a semiconductor device having a titanium salicide structure and a cobalt salicide structure, the first embodiment is not restricted in this manner, and can be applied as well to other high-melting-point metal salicide (for example, nickel). It will also be understood that the above-noted first and second embodiments, although described with regard to various specific values, are not restricted to those values.

In the first and second embodiments, the polysilicon film pattern of the high-melting point metal silicide film missing part detection element has alternating connection between an n⁺-type region and the p⁺-type region. However, the polysilicon film pattern of the high-melting-point metal silicide film missing part detection element of the present invention is not limited to this configuration.

Third Embodiment

Figure 8A:
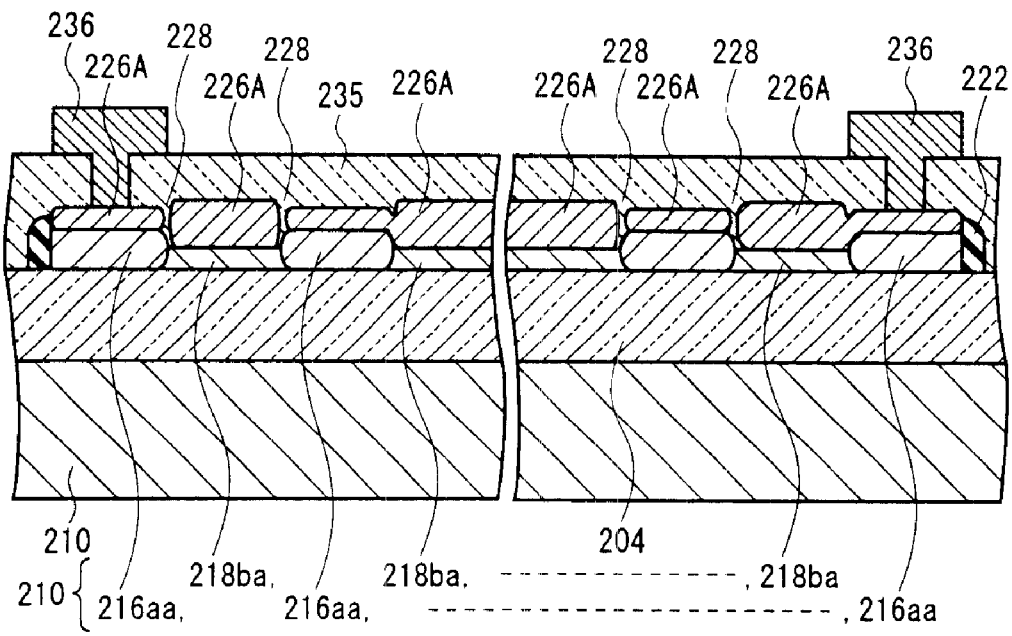
FIG. 8(a) is a schematic cross-sectional view showing a high-melting point metal silicide film missing part detection element according to the third embodiment of the present invention.
Figure 8B:
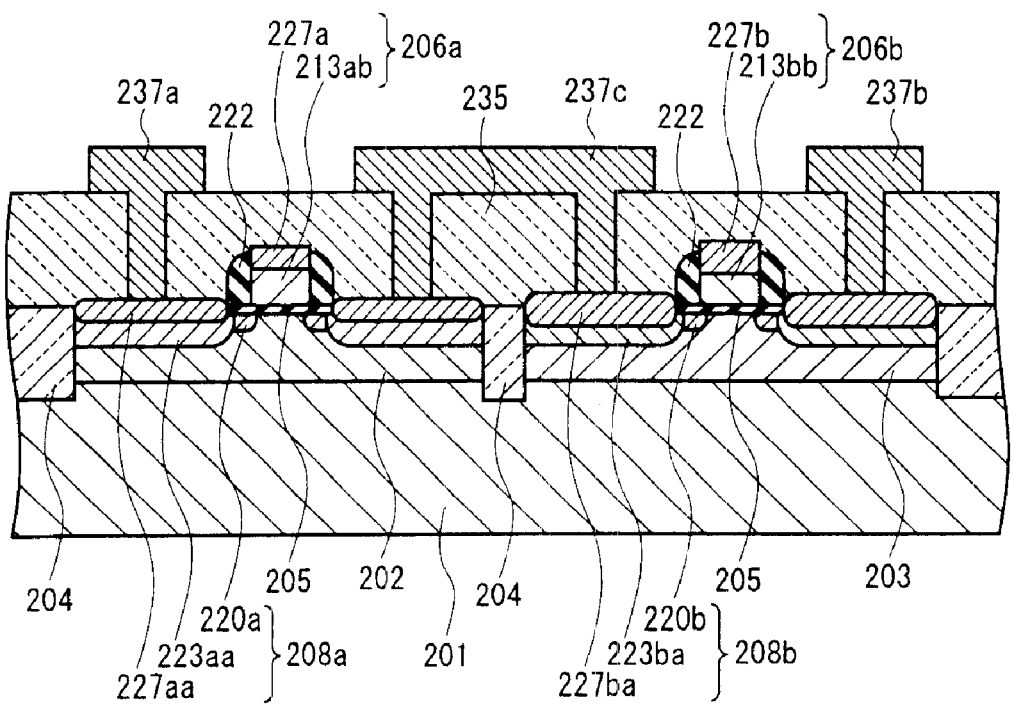
FIG. 8(b) is a schematic cross-sectional view showing a CMOS transistor having a salicide structure according to the third embodiment of the present invention.
Figure 9A:
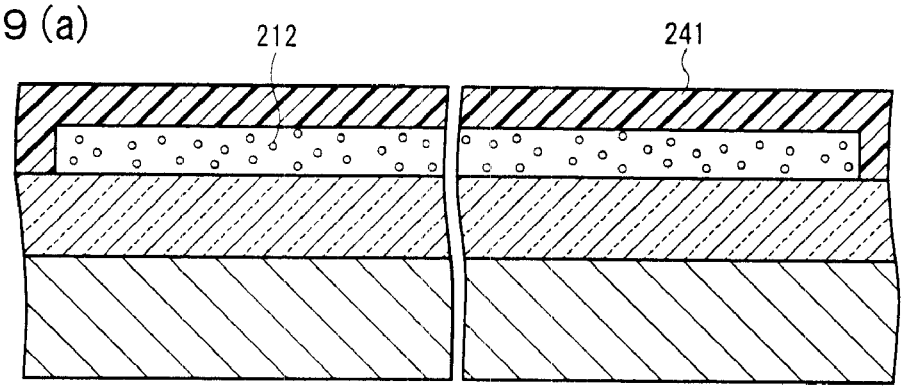
FIG. 9(a) to FIG. 9(d) are schematic cross-sectional views showing the manufacturing processes for a high-melting point metal silicide film missing part detection element according to the third embodiment of the present invention.
Figure 9B:
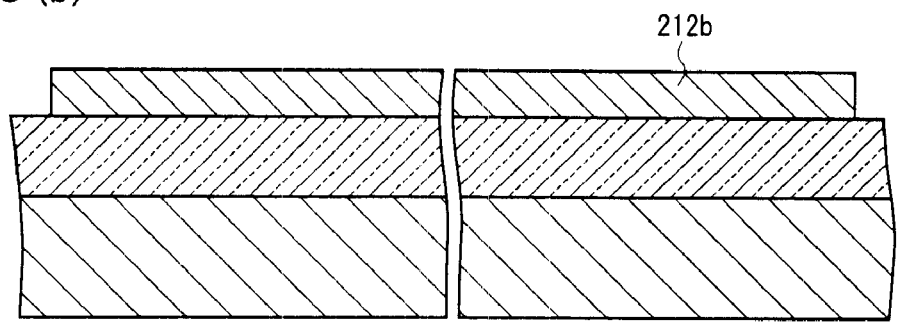
Figure 9C:
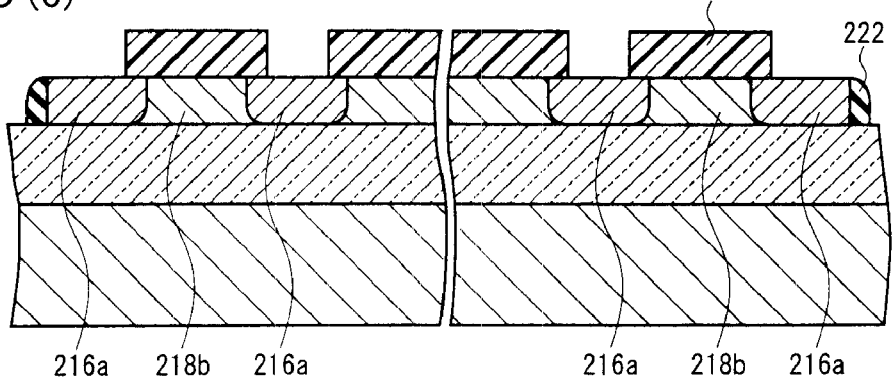
Figure 9D:
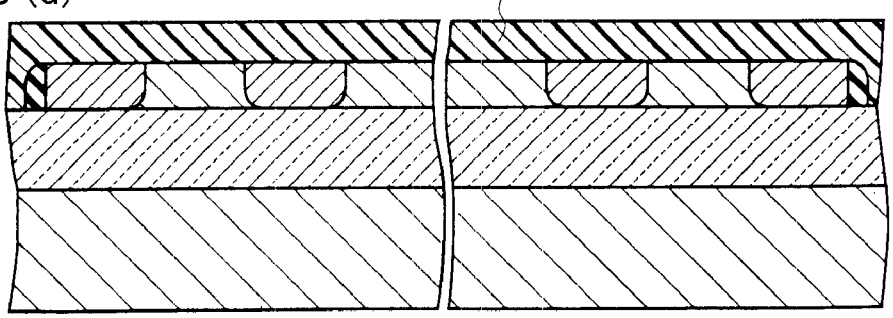

The third embodiment of the present invention will be described with reference to FIG. 8(b) which is a schematic cross-sectional view of a CMOS transistor having a salicide structure, and FIG. 8(a) which is a schematic cross-sectional view of a high-melting-point metal silicide film missing part detection element. The third embodiment differs from the first embodiment in that the semiconductor device according to the third embodiment includes a high-melting-point metal silicide film missing part detection element, in which an n⁺-type region and p-type region are alternately connected in a polysilicon film pattern, the structure of this semiconductor being described further below.

A p-type well 202, n-type well 203, and a field insulation film 204 are provided on the surface of a silicon substrate 201. The element separation region provided on the surface of the silicon substrate 201 is formed, for example, as an STI structure, in which a shallow groove is filled by the field insulation film 204. The p-type well 202 and n-type well 203 are separated by this field insulation film 204. An n-channel MOS transistor is provided on the surface of the p-type well 202, and a p-channel MOS transistor is provided on the surface of the n-type well 203, the above-noted high-melting-point metal silicide film missing part detection element being formed, for example, on the surface of the field insulation film 204. The n-channel MOS transistor, the p-channel MOS transistor and the high-melting-point metal silicide film missing part detection element are covered by an interlayer insulation film 235.

The n-channel MOS transistor is formed by a gate oxide film 205, a gate electrode 206a, provided on the surface of the p-type well 202, via the gate oxide film 205, and a source/drain region 208a provided on the surface on the p-type well 202. The side surface of the gate electrode 206a is directly covered by an insulation film spacer 222. The source/drain region 208a is formed by an n-type source/drain extension diffusion layer 220a provided on the surface of the p-type well 202, self-align to the polysilicon film pattern 213ab, an n⁺-type source/drain diffusion layer 223aa provided on the surface of the p-type well 202, self-align to the gate electrode 206a and insulation film spacer 222, and a titanium silicide layer 227aa provided on the surface of the n⁺-type source/drain diffusion layer 223aa, self-align with the gate electrode 206a and insulation film spacer 222. The gate electrode 206a is formed by an n⁺-type polysilicon film pattern 213ab which directly covers the gate oxide film 205 and extends over the surface of the field insulation film 204, and a titanium silicide film pattern 227 provided on the surface of the n⁺-type polysilicon film pattern 213ab in self-aligning manner.

The minimum line width of the gate electrode 206a is, for example, 0.2 μm to 0.35 μm, the thicknesses of the titanium silicide film 227a and the titanium silicide film 227aa are approximately 270 nm to 450 nm, and the depth of the junction of the n-type source/drain diffusion layer 223aa is, for example, approximately 0.15 μm. The n-type source/drain extension diffusion layer 220a is formed by ion implantation of arsenic in the order of $10^{14}$ cm$^{-2}$, and the n⁺-type source/drain diffusion layer 223aa is formed by ion implantation of arsenic to approximately $2\times10^{15}$ cm$^{-2}$. The insulation film spacer 222 is formed by a silicon oxide film or a silicon nitride film having a thickness of, for example, 50 nm. The thickness of the gate oxide film is, for example, approximately 5 nm to 6 nm.

The p-channel MOS transistor is formed by the gate oxide film 205, the gate electrode 206b provided on the surface of the n-type well 203 via the gate oxide film 205, and the source/drain region 208b provided on the surface of then-type well 203. The source/drain region 208b is formed by the p-type source/drain extension diffusion layer 220b provided on the surface of the n-type well 203, self-align to the polysilicon film pattern 213bb, the p⁺-type source/drain diffusion layer 223ba provided on the surface of the n-type well 203, self-align to the gate electrode 206b and the insulation film spacer 222, and the titanium silicide layer 227ba provided on the surface of the p⁺-type source/drain diffusion layer 223ba, self-align to the gate electrode 206b and the insulation film spacer 222. The gate electrode 206b is formed by the p⁺-type polysilicon film pattern 213bb that directly covers the gate oxide film 205 and extends over the surface of the field insulation film 204, and the titanium silicide film pattern 227b provided on the surface of the p⁺-type polysilicon pattern 213bb in self-aligned manner.

The minimum line width of the gate electrode 206b is the same as the minimum line width of the gate electrode 206a. The film thickness of the titanium silicide film 227b and titanium silicide film 227ba is smaller than the film thickness of the titanium silicide film 227a and titanium silicide film 227aa by approximately 10%, this being approximately 300 nm to 500 nm. The depth of the junction of the p⁺-type source/drain diffusion layer 223ba is, for example, approximately 0.2 μm. The p-type source/drain extension diffusion layer 220b is formed by ion implantation of boron or boron fluoride to the order of $10^{14} cm^{-2}$. The p⁺-type source/drain diffusion layer 223ba is formed by ion implantation of boron to approximately $5 \times 10^{15}$ $cm^{-2}$, using an energy, for example, of 2 keV.

Contact holes are formed in the interlayer insulation film 235 so as to extend to the source/drain regions 208a and 208b. On the surface of the interlayer insulation film 235, via these contact holes, are formed, for example, a metal interconnect 237a connected to one side of the source/drain region 208a, a metal interconnect 237b connected to one side of the source/drain region 208b, and a metal interconnect 237c connected to the other source/drain region 208a and the other source/drain region 207b. For example, the metal interconnect 237a is connected to the power supply voltage, and the metal interconnect 237b is connected to the ground voltage.

A high-melting-point metal silicide film missing part detection element is formed, for example, by a polysilicon film pattern so as to directly cover the surface of a field insulation film 204, and a titanium silicide film pattern 226A provided on the surface of the polysilicon film pattern 210 in self-aligning manner. The minimum line width of the high-melting-point metal silicide film missing part detection element is the same as the minimum line width of the gate electrode 206a. The side surface of the high-melting-point metal silicide film missing point detection element as well is directly covered by the insulation film spacer 222. In this embodiment as well, the high-melting-point metal silicide film missing part detection element is not restricted to being provided on the surface of the field insulation film 204, and can alternately be provided, for example, so as to directly cover the surface of the gate oxide film 205.

The polysilicon film pattern 210, in contrast to the above-noted first embodiment, is formed by an alternate connection between the n⁺-type region 216aa and p-type region 218ba. The film thickness of the titanium silicide film pattern 226A is not uniform, but rather has a thickness that is the same of the film thickness of the titanium silicide film pattern 227a in the part above the surface of the n⁺-type region 216aa, and is thicker than the titanium silicide film 227b in the part on the surface of the p-type region 218ba. Directly above the junction part between the n⁺-type region 216aa and p-type region 218ba a missing part 228 can occur in the titanium silicide film pattern 226A.

Contact holes that reach the two end parts of the high-melting-point metal silicide film missing part detection element are provided in the interlayer insulation film 235. A pair of metal interconnects 236 which are connected respectively to the end part of the high-melting-point metal silicide film missing part detection element are provided on the surface of the interlayer insulation film 235, via these contact holes. For this reason, the line width at the two ends of the high-melting-point metal silicide film missing part detection element are both wider than this minimum line length (for example, approximately 0.5 μm). Additionally, the two end parts of the polysilicon film pattern 216 are formed by the n⁺-type region 216aa. In the case in which it is necessary to detect the above-noted missing part 288 immediately before formation of the interlayer insulation film 235, the line width of both ends of the high-melting-point metal silicide film missing part detection element, because of the need to make connection to this part using a needle probe, is made, for example, 20 μm or larger.

In this embodiment of the present invention as well, similar to the case of the first embodiment, in a semiconductor device including a CMOS transistor having a salicide structure, the above-noted high-melting-point metal silicide film missing part detection element, formed by a polysilicon film pattern 210 and a titanium silicide film pattern 226A is provided, so that it easy to detect a minute missing part in the high-melting-point metal silicide film in the gate electrode made of a polycide interconnect.

Additionally, in this embodiment of the present invention, as described above, the ratio of (thickness of the titanium silicide film pattern 226A directly above the p-type region 218ba)/(thickness of the titanium silicide film pattern 226A directly above the n⁺-type region 216aa) is a greater value than the ratio of (thickness of the titanium silicide pattern 126A directly above the p⁺-type region 116ba)/(thickness of the titanium silicide film pattern 126A directly above the n⁺-type region 116ab). That is, the rate of occurrence of the missing part 228 is greater than that of the missing part 128. As a result, the detection rate of missing parts in the high-melting-point metal silicide film of the gate electrode in this example of the present invention is higher than the first embodiment of the present invention.

Although the above-noted embodiment of the present invention relates to a semiconductor device having a titanium salicide structure, the third embodiment is not restricted in this manner, and the third embodiment can be similarly applied to the case of a different high-melting-point metal salicide in which the film thickness of the high-melting-point metal silicide on the n⁺-type silicon surface when silicidation occurs is smaller (thinner) than the film thickness of the high-melting-point metal silicide film on formed the p-type silicon surface. It will also be understood that the various values presented in the above-noted description of the example of the third embodiment of the present invention are not restricted to those values.

This third embodiment of the present invention will be described further below, with reference to the FIG. 9 and FIG. 10, which are schematic cross-sectional views of the manufacturing process or high-melting-point metal silicide missing part detection element, FIG. 11 and FIG. 12, which are schematic cross-sectional views showing a manufacturing process for a titanium salicide structure CMOS transistor, and the above-noted FIG. 8.

First, a p-type well 202, and n-type well 203, and a field insulation film 204 made from a silicon oxide insulation film are formed on the surface of a silicon substrate 201. A gate oxide film 205 having a thickness of, for example, 5 nm to 6 nm is formed on the surface of the p-type well 202 and n-type well 203, using thermal oxidation.

Next, a process such as low-pressure CVD is used to form an undoped polysilicon film (not shown in the drawing) to a thickness of approximately 150 nm to 200 nm over the entire surface of the substrate 201, this undoped polysilicon film being then patterned and an undoped polysilicon film pattern 212 of the high-melting-point metal silicide film missing part detection element and undoped polysilicon film pattern 213 for a gate electrode being formed. The minimum line width of the undoped polysilicon film pattern 212 is the same as the minimum line width of the undoped polysilicon film pattern 213, this being for example 0.2 $\mu$m to 0.35 $\mu$m. The line width of the two ends of the undoped polysilicon film 212 are wider than this minimum line width, this being, for example, approximately 0.5 $\mu$m, which can be made to 5 $\mu$m or greater, if necessary.

Next, a first photoresist film pattern 241, having an aperture at a part corresponding to the p-type well 202, and covering the undoped polysilicon film pattern 212 and at least the surface of the n-type well 203 is formed. This photoresist film pattern 241 is used as a mask in performing ion implantation of arsenic to the order of $10^{14}$ cm$^{-2}$, thereby a part of the undoped polysilicon film pattern 213 becoming the n-type polysilicon film pattern 213a simultaneously with which an n-type source/drain extension diffusion layer 220a is formed on the surface of the p-type well 202, self-aligned to the n-type polysilicon film pattern 213a (FIG. 9(a), FIG. 11(a)).

After removing the above-noted photoresist film pattern 241, a second photoresist film pattern 242 is formed, the photoresist film pattern 242 has apertures at a part corresponding to the n-type well 203 and the part corresponding to the undoped polysilicon film pattern 212, and minimally covers the surface of the p-type well 202. This photoresist film pattern 242 is used as a mask in performing ion implantation of boron (or boron fluoride) to the order of $10^{14}$ cm$^{-2}$, the remaining part of the undoped polysilicon film pattern 213 becoming the p-type polysilicon film pattern 213b, simultaneously with which a p-type source/drain extension diffusion region 220b is formed on the surface of the n-type well 203, self-align to the p-type polysilicon film pattern 213b, and simultaneously with which the undoped polysilicon film pattern 212 becomes the p-type polysilicon film pattern 212b (FIG. 9(b), FIG. 11(b)).

In this embodiment of the present invention as well, there is no restriction to the sequence of the process steps related to the photoresist film patterns 241 and 242, and it is possible to reverse this sequence. Additionally, if necessary it is possible to use the photoresist film patterns 241 and 242 as mask for ion implantation of a p-type impurity and an n-type impurity, so as to form a p-type pocket diffusion layer and n-type pocket diffusion layer, respectively, on the surfaces of the p-type well 202 and n-type well 203.

Next, the photoresist film pattern 242 is removed, and insulation film (made of silicon oxide or silicon nitride) is formed on the entire surface to a film thickness of, for example, 50 nm, using a low-pressure CVD process. This insulation film is etched back using anisotropic edging, so as to form insulation film spacer 222 on the side surfaces of the p-type polysilicon film pattern 212b, n-type polysilicon film pattern 213a, and p-type polysilicon film pattern 213b.

Next, a third photoresist film pattern 243 is formed. The photoresist pattern 243 has an aperture in a part corresponding to the p-type well 202 and minimally covers the surface of the n-type well 203. Additionally, the photoresist film pattern 243 is provided with a plurality of apertures in a part that covers the p-type polysilicon film pattern 212b. The aperture width and aperture spacing in the part that covers the p-type polysilicon film pattern 212b (a part other than the end part of the p-type polysilicon film pattern 212b), are, respectively, approximately 0.4 $\mu$m and 0.6 $\mu$m. This photoresist film pattern 243 is used as a mask, for example, to perform ion implantation of arsenic to approximately $2\times10^{15}$ cm$^{-2}$, thereby the n-type polysilicon film pattern 213a becoming the n$^+$-type polysilicon film pattern 213aa and an n$^+$-type source/drain diffusion layer 223a being formed on the surface of the p-type well 202, self-aligned with the n$^+$-type polysilicon film pattern 213aa and insulation film spacer 222. Simultaneously with this, an n$^+$-type region 216a is formed on the p-type polysilicon film pattern 212b, the remaining part becoming the p-type region 218b. The depth of the junction of the n$^+$-type source/drain diffusion layer 223a is, for example, approximately 0.15 $\mu$m, and the length and spacing of the n$^+$-type region 216a are approximately 0.5 $\mu$m (FIG. 9(c), FIG. 11(c)).

Next, after removing the above-noted photoresist film pattern 243 a fourth photoresist film pattern 244 is formed. The photoresist film pattern 244 has an aperture in a part corresponding to the n-type well 203, and covers a polysilicon film pattern having alternate connection between the n$^+$-type region 216a and p-type region 218b and minimally the surface of the p-type well 202. The photoresist film pattern 244 is used as a mask, for example, in performing ion implantation of boron to approximately $5\times10^{15}$ cm$^{-2}$ using an energy of 2 keV, thereby the p-type polysilicon film pattern 213b becoming the p$^+$-type polysilicon film pattern 213ba and a p$^+$-type source/drain diffusion layer 223b being formed on the surface of the n-type well 203, self-aligned to the p$^+$-type polysilicon film pattern 213ba and the insulation film spacer 222. The depth of the junction of the p$^+$-type source/drain diffusion layer 223b is, for example, approximately 0.2 $\mu$m (FIG. 9(d), FIG. 11(d)). In these example of the present invention as well, there is no restriction with regards to the sequence of the process steps related to the photoresist film pattern 243 and 244, which can be reversed.

Figure 10A:
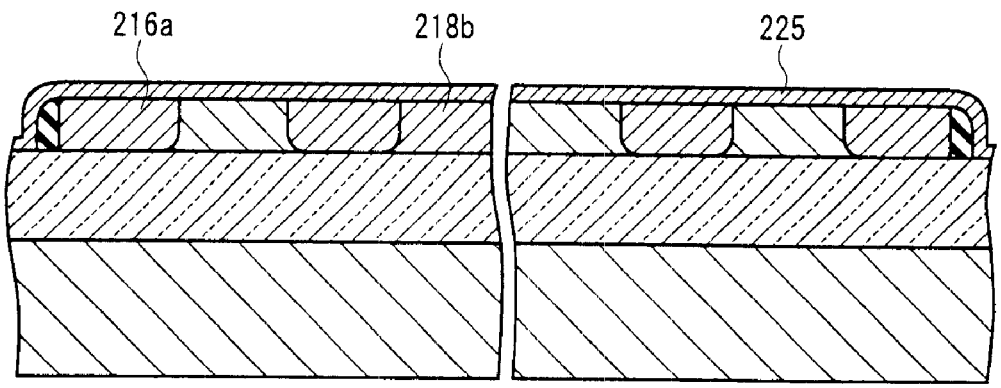
FIG. 10 (a) to FIG. 10(c) are schematic cross-sectional views showing the manufacturing processes for a high-melting point metal silicide film missing part detection element according to the third embodiment of the present invention.
Figure 10B:
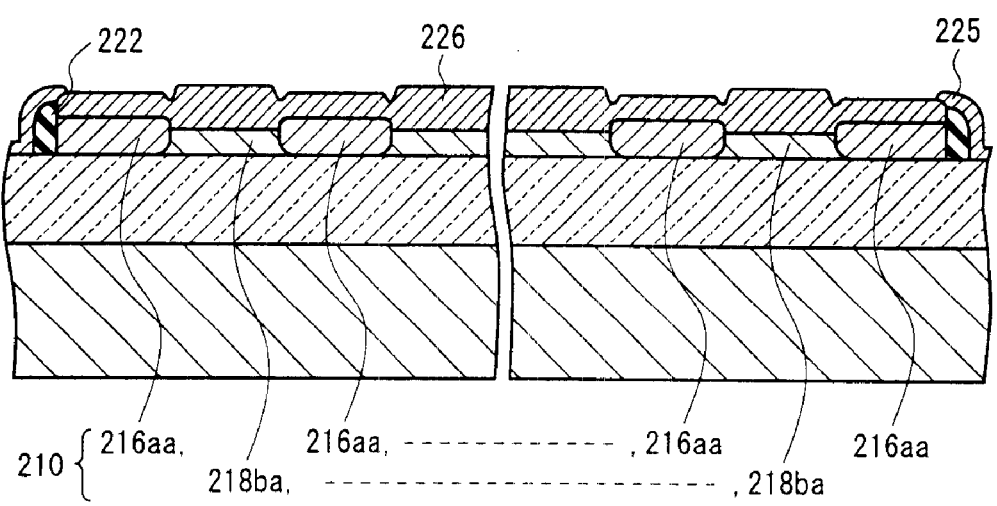
Figure 12A:
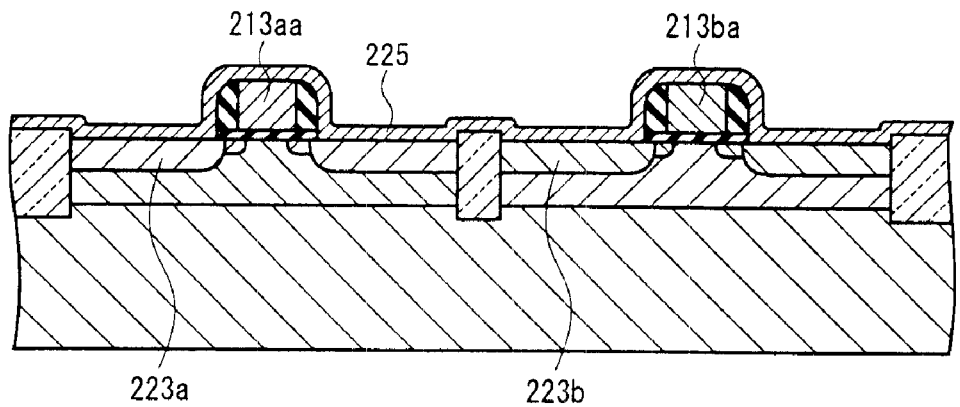
FIG. 12(a) to FIG. 12(c) are is schematic cross-sectional views showing the manufacturing processes for a CMOS transistor according to the third embodiment of the present invention.
Figure 12B:
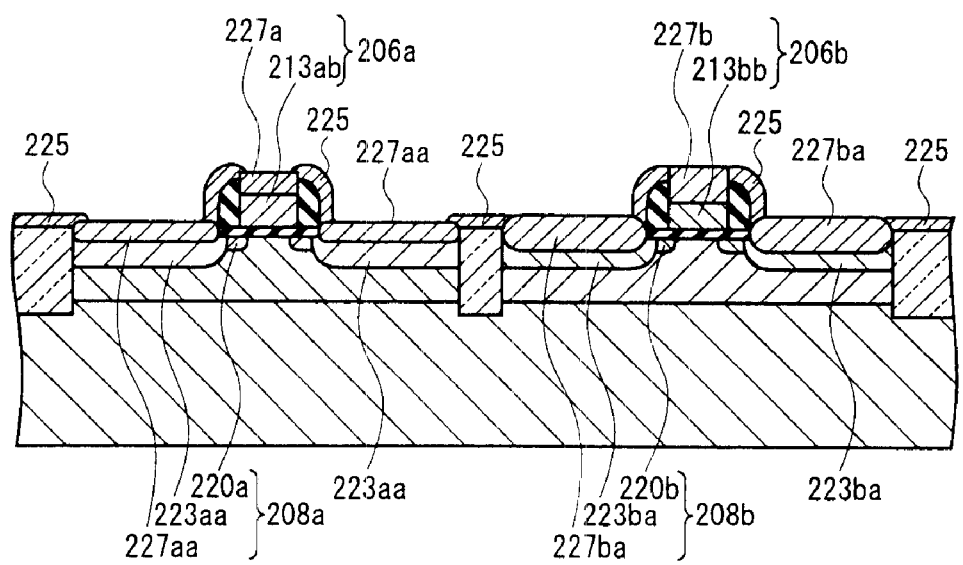

Next, after removing the above-noted photoresist film pattern 244, sputtering or the like is used to form a titanium film 225 over the entire surface (FIG. 10(a), FIG. 12(a)).

A siliciding reaction is cause to occur at a prescribed temperature. By doing this, in a part that becomes the high-melting-point metal silicide film missing part detection element, the n$^+$-type region 216a and p-type region 218b become, respectively, the n$^+$-type region 216aa and p-type region 218ba, accordingly the original undoped polysilicon film pattern 212 becoming a polysilicon film pattern 210, having alternate connection between the n$^+$-type region 216aa and p-type region 218ba, with a titanium silicide film pattern 226 formed on the surface of the polysilicon film pattern 210 in self-aligning manner.

In the part that becomes the n-channel MOS transistor, the n$^+$-type polysilicon film pattern 213aa becomes the n$^+$-type polysilicon film pattern 213ab, and a titanium silicide film pattern 227a is formed in self-aligned manner on the surface of the n$^+$-type polysilicon film pattern 213ab, these laminated semiconductor layers forming the gate electrode 206a.

Simultaneously with this, the n$^+$-type source/drain diffusion layer 223a becomes the n$^+$-type source/drain diffusion layer 223aa, and the titanium silicide layer 227aa is formed in self-aligned manner on the n$^+$-type source/drain diffusion layer 223aa, thereby forming a source/drain region 208a by the n-type source/drain extension diffusion layer 220a, the n$^+$-type source/drain diffusion layer 223aa and the titanium silicide layer 227aa.

In the part that becomes the p-channel MOS transistor, the p⁺-type polysilicon film pattern 213ba becomes the p⁺-type polysilicon film pattern 213bb and a titanium silicide film pattern 227b is formed in self-aligning manner on the surface of the p⁺-type polysilicon film pattern 213bb, these laminated semiconductor layers forming the gate electrode 206b. Simultaneously with this the p⁺-type source/drain diffusion layer 223b becomes the p⁺-type source/drain diffusion layer 223ba and a titanium silicide layer 227ba is formed in self-aligning manner on the surface of the p⁺-type source/drain diffusion layer 223ba, thereby forming a source/drain region 208b that is formed by the p-type source/drain extension diffusion layer 220b, the p⁺-type source/drain diffusion layer 223ba and the titanium silicide layer 227ba (FIG. 10(b), FIG. 12(b)).

In the above described titanium siliciding reaction, it is known that silicon diffuses into the titanium. If boron is present in high concentration in the silicon, the siliciding reaction speed will become low. Additionally, in this reaction the occurrence of titanium silicide kernels is higher in a p-type layer silicon surface having a low impurity concentration than in a p⁺-type layer silicon surface. As a result, the film thickness of the titanium silicide film pattern 226 directly above the n⁺-type region 216aa is thinner than that of the titanium silicide film pattern 226 directly above the p-type region 218ba.

Figure 10C:
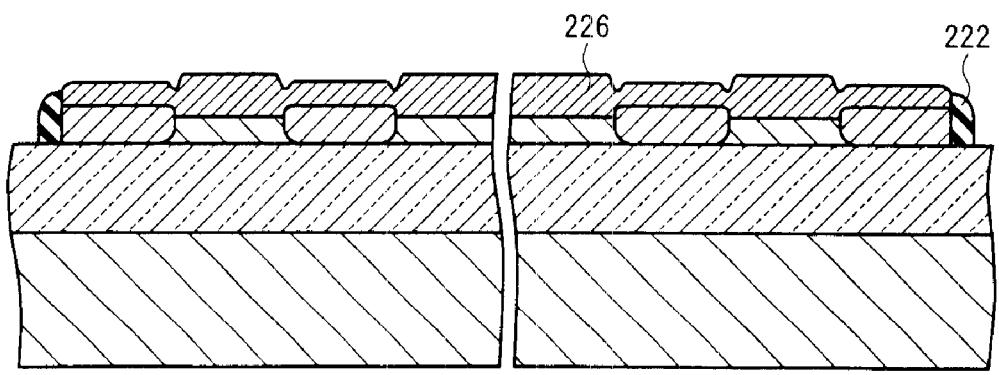
Figure 11A:
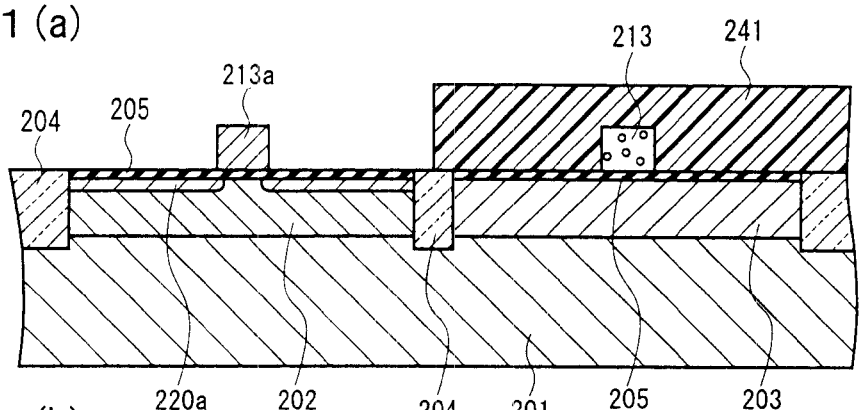
FIG. 11(a) to FIG. 11(d) are is schematic cross-sectional views showing the manufacturing processes for a CMOS transistor according to the third embodiment of the present invention.
Figure 11B:
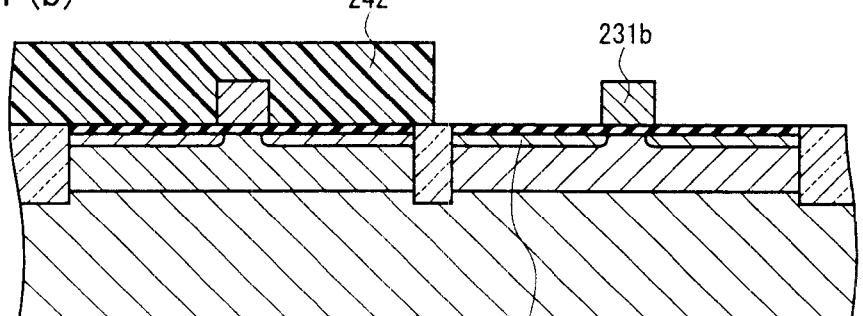
Figure 11C:
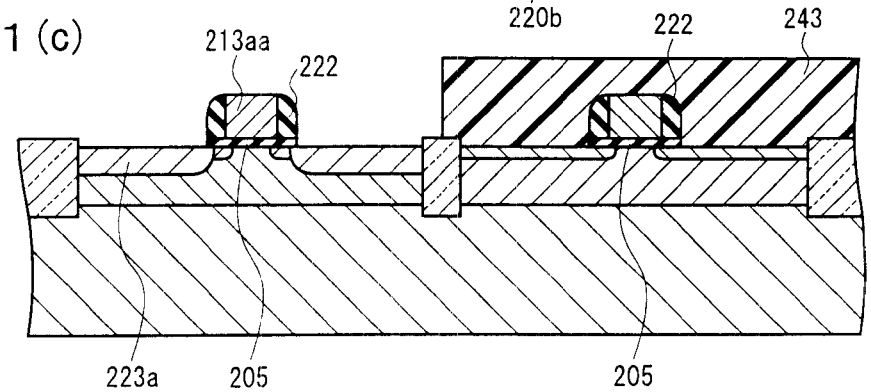
Figure 11D:
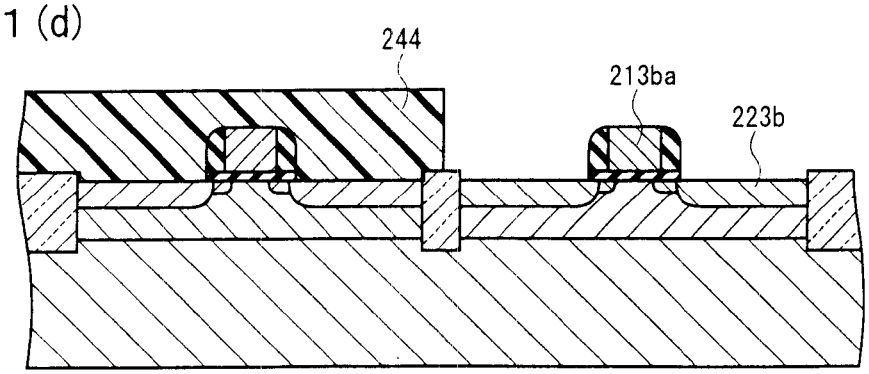
Figure 12C:
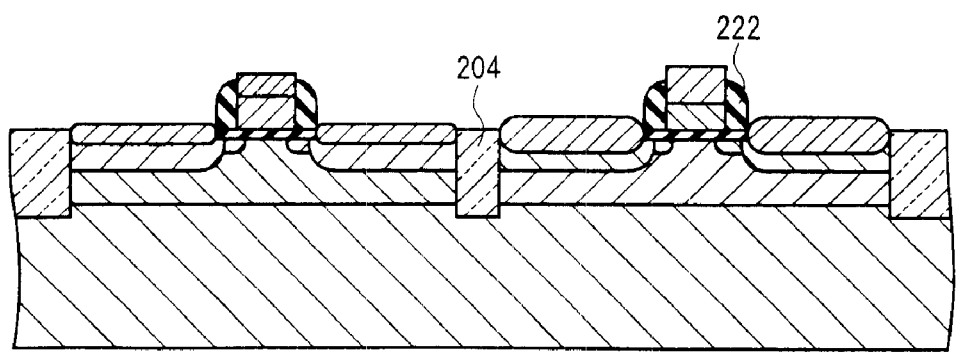
Figure 14A:
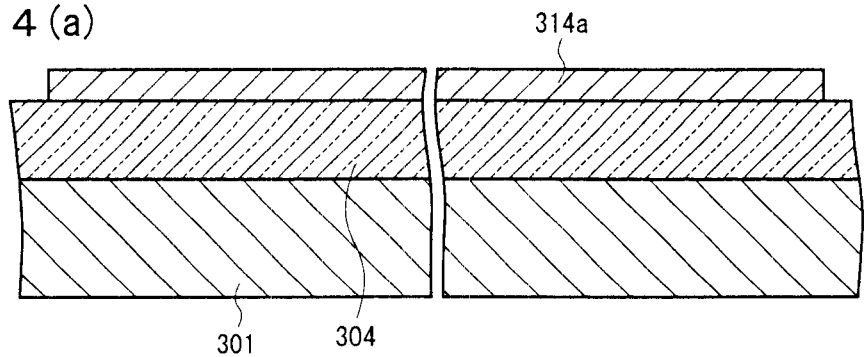
FIG. 14(a) to FIG. 14(d) are schematic cross-sectional views showing the manufacturing processes for a high-melting point metal silicide film missing part detection element according to the fourth embodiment of the present invention.
Figure 14B:
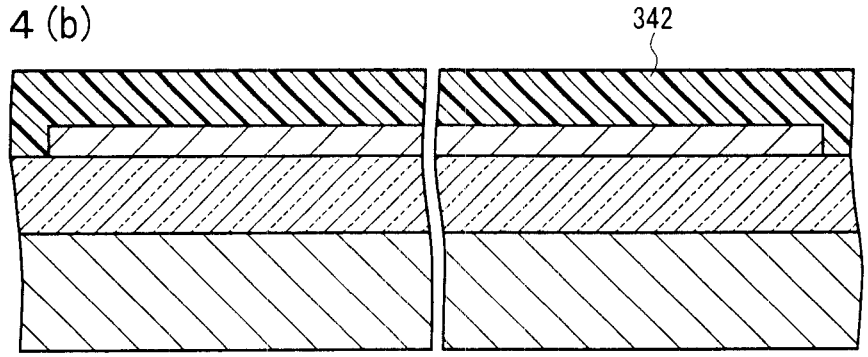
Figure 14C:
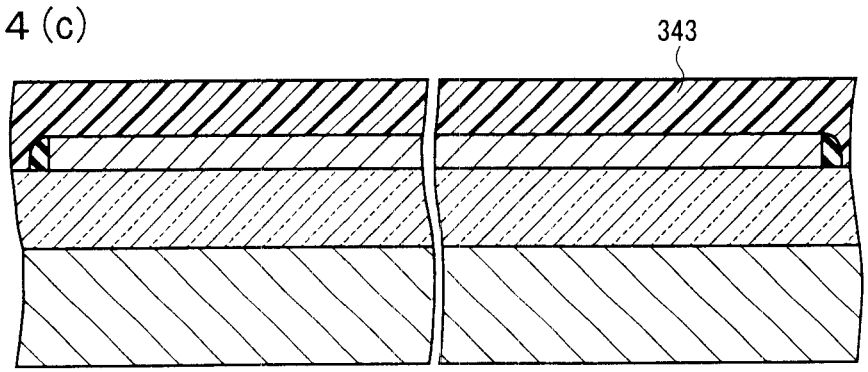
Figure 14D:
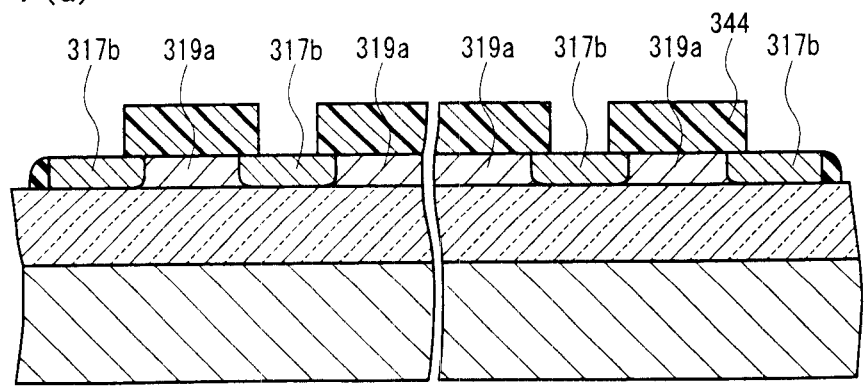

Next, the unreacted titanium film which directly covers the surface of the field insulation film 204 and insulation film spacer 222 is selectively removed (FIG. 10(c), FIG. 12(c)).

After the above, an interlayer insulation film 235, formed by a silicon oxide insulation film, is formed over the entire surface, and contact holes are formed in this interlayer insulation film. Additionally, metal interconnects 236, 237a, 237b, and 237c are formed in the surface of the interlayer insulation film 235, thereby completing the semiconductor device according to the third embodiment of the present invention (FIG. 8).

During the manufacturing process including the above-noted siliciding reaction, and after the completion of the semiconductor device, in the titanium silicide film pattern 226 that forms the high-melting-point metal silicide film missing part detection element, a missing part 228 occurs at a position corresponding to a position directly above the jointing part between the n⁺-type region 216aa and p-type region 218b in the polysilicon film pattern 210, so that the titanium silicide film pattern 226 becomes the titanium silicide pattern 226A. The occurrence of the missing part 228 is due to the difference in film thicknesses between the film thickness of the titanium silicide film pattern above the n⁺-type region 216aa and the film thickness of the titanium silicide pattern film above the p-type region 218ba.

Additionally coagulation of the titanium silicide film occurred in the phase transition is also a cause of the tendency for the above-noted missing part 228 to occur.

Fourth Embodiment

The fourth embodiment of the present invention will be described with reference to FIG. 13(b) which is a schematic cross-sectional view of a CMOS transistor having a salicide structure, and FIG. 13(a) which is a schematic cross-sectional view of a high-melting-point metal silicide film missing part detection element. The fourth embodiment differs from the second embodiment in that the semiconductor device according to the fourth embodiment includes a high-melting-point metal silicide film missing part detection element, in which an p⁺-type region and n-type region are alternately connected in a polysilicon film pattern, the structure of this semiconductor being described further below.

In this semiconductor device, a p-type well 302, an n-type well 303, and a field insulation film 304 are provided on the surface of a silicon substrate 301. An n-channel MOS transistor provided on the surface of the p-type well 302 and a p-channel MOS transistor provided on the surface of the n-type well 303 are provided on the surface of the n-channel well 303, the above-noted high-melting-point metal silicide film missing part detection element being provided, for example, on the surface of the field insulation film 304. The n-channel MOS transistor, p-channel MOS transistor, and high-melting-point metal silicide film missing part detection element are covered by an interlayer insulation film 335.

The n-channel MOS transistor is formed by a gate oxide film 305, a gate electrode 307a provided on the surface of the p-type well 302 via the gate oxide film 305, and a source/drain region 309a provided on the surface of the p-type well 302. The side surface of the gate electrode 307a is directly covered by an insulation film spacer 322. The source/drain region 309a is formed by an n-type source/drain extension diffusion region 321a provided on the surface of the p-type well 302, self-align to the polysilicon film pattern 315a, an n⁺-type source/drain diffusion layer 324aa provide on the surface of the p-type well 302, self-aligned to the gate electrode 307a and the insulation film spacer 322, and a cobalt silicide layer 332aa provided on the surface of the n⁺-type source/drain diffusion layer 324aa, self-aligned to the gate electrode 307a and insulation film spacer 322. The gate electrode 307a is formed by a n⁺-type polysilicon film pattern 315ab that directly covers the surface of the gate oxide film 305 and extends over the surface of the field insulation film 304, and a cobalt silicide film pattern 332a formed on the surface of the n-type polysilicon film pattern 315ab, in self-aligning manner.

The minimum line width of the gate electrode 307a is, for example, 0.18 μm and less, the thicknesses of the cobalt silicide film 332a and the cobalt silicide film 332aa are approximately 250 nm to 350 nm, and the depth of the junction of the n⁺-type source/drain diffusion layer 324aa is, for example, approximately 0.1 μm. The n-type source/drain extension diffusion layer 321a is formed by ion implantation of arsenic in the order of $10^{14}$ cm⁻², and the n⁺-type source/drain diffusion layer 324aa is formed by ion implantation of arsenic to approximately $5 \times 10^{15}$ cm⁻². The insulation film spacer 322 is formed by a silicon oxide film or a silicon nitride film having a thickness of, for example, 50 nm. The thickness of the gate oxide film 305 is, for example, approximately 2.5 nm to 3.5 nm.

The p-channel MOS transistor is formed by the gate oxide film 305, the gate electrode 307b provided on the surface of the n-type well 303 via the gate oxide film 305, and the source/drain region 309b provided on the surface of the n-type well 303. The source/drain region 309b is formed by the p-type source/drain extension diffusion layer 321b provided on the surface of the n-type well 303, self-aligned to the polysilicon film pattern 315b, the p⁺-type source/drain diffusion layer 324ba provided on the surface of the n-type well 303, self-aligned to the gate electrode 307b and the insulation film spacer 322, and the cobalt silicide layer 332ba provided on the surface of the p⁺-type source/drain diffusion layer 324ba, self-aligned to the gate electrode 307b and the insulation film spacer 322. The gate electrode 307b is formed by the p⁺-type polysilicon film pattern 315bb that directly covers the gate oxide film 305 and extends over the surface of the field insulation film 304, and the cobalt silicide film pattern 332b provided on the surface of the p+-type polysilicon pattern 315bb in self-aligned manner.

The minimum line width of the gate electrode 307b is the same as the minimum line width of the gate electrode 307a. The film thickness of the cobalt silicide film 332b and the cobalt silicide layer 332ba is approximately 5% thinner than the film thicknesses of the cobalt silicide film 332a and cobalt silicide layer 332aa, respectively, these film thicknesses are, for example, approximately 240 nm to 330 nm.

The depth of the junction of the p+-type source/drain diffusion layer 324ba is, for example, approximately 0.15 μm. The p-type source/drain extension diffusion layer 321b is formed by ion implantation of either boron of boron fluoride to the order of $10^{14}$ cm$^{-2}$. The p+-type source/drain diffusion layer 324ba is formed by ion implantation of boron to approximately $2\times10^{15}$ cm$^{-2}$ to $3\times10^{15}$ cm$^{-2}$, with an energy, for example, 2 keV.

Contact holes are provided in the interlayer insulation film 335, so as to reach the source/drain regions 309a and 309b. In the surface of the interlayer insulation film 335, a metal interconnect 339a connected to one side of the source/drain region 309a, a metal interconnect connected to one side of the source/drain region 309b, and a metal interconnect 339c connected to the other source/drain region 309a and the other source/drain region 309b are formed, via these contact holes. For example, the metal interconnect 339a is connected to a power supply voltage, and a metal interconnect 339b is connected to a ground voltage.

The high-melting-point metal silicide film missing part detection element is formed, for example, by a polysilicon film pattern 311 that directly covers the surface of the field insulation film 304, and a cobalt silicide film pattern 331A provided on the surface of the polysilicon film pattern 311 formed in self-aligned manner. The minimum line width of the high-melting-point metal silicide film missing part detection element is the same as the minimum line width of the gate electrode 307a. The side surfaces of the high-melting-point metal silicide film missing part detection element as well are directly covered by the insulation film spacer 322. In this example of the present invention as well, there is no restriction to the high-melting-point metal silicide film missing part detection element being formed on the surface of the field insulation film 304, and it is possible, for example, to have a configuration in which there is direct covering of the gate oxide film 305.

The polysilicon film pattern 311 is formed by the alternating connection between the n-type region 319aa and the p-type region 317ba. The length of the n-type 319aa and the p-type region 317ba, are approximately 0.5 μm, respectively. The film thickness of the cobalt silicide film pattern 331A in this case as well is not uniform. The thickness of the part above the n-type region 319aa is thinner than the film thickness of the cobalt silicide film pattern 332a, and the thickness of the part above the P+-type region 317ba is the same thickness of the cobalt silicide film pattern 332b. Directly above the junction part between the n-type region 319aa and the p+-type region 317ba, a missing part 333 occurs in the cobalt silicide film pattern 331A.

The interlayer insulation film 335 is provided with a contact hole that extends to the two end parts of the high-melting point metal silicide film missing part detection element. A pair of metal interconnects 338 are provided on the surface of the interlayer insulation film 335, so as to make connection to the end parts of the high-melting point metal silicide film missing part detection element. For this reason, the line width of the two ends of the high-melting point metal silicide film missing part detection element are wider than the minimum line width thereof (for example, approximately 0.5 μm). Additionally, the two end pars of the polysilicon film pattern 310 are each p+-type regions 317ba. In the case in which the above-noted missing part 333 is to be detected immediately before formation of the interlayer insulation film 335, the line width at the two end parts of the high-melting point metal silicide film missing part detection element are made 20 μm, for example, because of the need to make contact with these parts using a needle probe.

The silidation in the cobalt silicide, in contrast to the case of titanium silicide, is known to exhibit cobalt diffusing into the silicon. The reason that the thicknesses of the cobalt silicide film pattern 331A at a portion directly above the n-type region 319aa, the cobalt silicide film 332a, the cobalt silicide film 332b decrease in this sequence is because the ratio of occurrence of cobalt silicide seeds decreases in the sequence of the n-type layer, n+-type layer, and p+-type layer. The reason that the missing part 333 occurs in the cobalt silicide film pattern 331A is due to the difference between the film thickness of the cobalt silicide film pattern 331A at the n-type region 319aa and the film thickness of the cobalt silicide film pattern 331A at the p+-type region 317ba, similar to the case of a titanium silicide pattern. These missing parts 333, similar to the case of the first embodiment of the present invention, occur at the silicidation steps and thereafter, and further occur after the completion of the semiconductor device.

This embodiment of the present invention achieves the effects of the second embodiment.

Additionally, in this embodiment, the ratio of (film thickness of cobalt silicide film pattern 331A directly above the n-type region 319aa)/(film thickness of cobalt silicide film pattern 331A directly above the p+-type region 317ba) becomes greater than the ratio of (film thickness of cobalt silicide film pattern 131A directly above the n+-type region 117ab)/(film thickness of cobalt silicide film pattern 131A directly above the p+-type region 117ba) (shown in the second embodiment). As a result, the detection rate of missing parts in the high-melting-point metal silicide film of the gate electrode in this embodiment is higher than the case of the second embodiment.

The manufacturing process for the fourth embodiment of the present invention is described below, with references being made to FIG. 14 and FIG. 15, which are schematic cross-sectional views showing the manufacturing process for the high-melting point metal silicide film missing part detection element, FIG. 16 and FIG. 17, which are schematic cross-sectional views showing the manufacturing process for the CMOS transistor having a cobalt salicide structure, and the above-noted FIG. 13.

First, a p-type well 302, an n-type well 303, and a field insulation film 304 made of a silicon oxide insulation film are formed on the surface of a silicon substrate 301. A gate oxide film 305, having a film thickness of, for example, 2.5 to 3.5 nm, is formed on the surface of the p-type well 302 and the n-type well 303.

Next, an undoped polysilicon film to a thickness of approximately 150 nm is formed on the entire surface, and this undoped polysilicon film is patterned, thereby forming an undoped polysilicon film pattern for a high-melting point metal silicide film missing part detection element on, for example, the field insulation film 304. Simultaneously, the undoped polysilicon film pattern 315 for the gate electrode on the gate electrode oxide 305 is formed, for example, extending from the surface of the p-type well 302, via the surface of the field insulation film 304, to the surface of the n-type well 303. The minimum line widths of these undoped polysilicon film patterns is, for example, less than 0.18 µm. The line width at both end parts of the undoped polysilicon film pattern for the high-melting point metal silicide film missing part detection element is made wider than this minimum line width, this being for example approximately 0.5 µm, and 20 µm or greater, if necessary.

Next, a first photoresist film pattern 341 is formed on the substrate 301. The photoresist film pattern 341 has an aperture in the surface of the p-type well 302 and an undoped polysilicon film pattern part for the high-melting point metal silicide film missing part detection element, the first photoresist film pattern 341 minimally covering the surface of the n-type well 303. The photoresist film pattern 341 is used as a mask to perform ion implantation of arsenic to the order of $10^{14}$ cm$^{-2}$, thereby the undoped polysilicon film pattern 315 of a part corresponding to the gate electrode of the n-channel MOS transistor becoming a n-type polysilicon film pattern 315a, simultaneously with which an n-type source/drain extension diffusion layer 321a is formed on the surface of the p-type well 302, self-aligned with the n-type polysilicon film pattern 315a, and the above-noted undoped polysilicon film pattern for the high-melting point metal silicide film missing part detection element becoming the n-type polysilicon film pattern 314a (FIG. 14(a) and FIG. 16(a)).

After removal of the above-noted photoresist film pattern 341, a second photoresist film pattern 342 which has the same shape as the photoresist film pattern 142 used in the first embodiment, is formed. This photoresist film pattern 142 is used as a mask to perform ion implantation of boron (or boron fluoride) to the order of $10^{14}$ cm$^{-2}$, so that the remaining part of the undoped polysilicon film pattern 315 becomes a p-type polysilicon film pattern 315b, simultaneously with which a p-type source/drain extension diffusion layer 321b is formed on the surface of the n-type well 303, self-aligned with the p-type polysilicon film pattern 315b (FIG. 14(b) and FIG. 16(b)).

In this embodiment as well, there is no restriction with regard to the sequence of the steps relating to the photoresist film patterns 341 and 342, which can be reversed. If necessary, it is possible to perform ion implantation of a p-type impurity and n-type impurity using the photoresist film patterns 341 and 342 as masks, so as to form on the surfaces of the p-type well 302 and the n-type well 303 a p-type pocket diffusion layer and an n-type pocket diffusion layer, respectively.

Next, after removal of the above-noted photoresist film pattern 342, a silicon oxide or silicon nitride film is formed over the entire surface, using an LPCVD process, this insulation film being etched back using an anisotropic etching process, so that an insulation film spacer 322 is formed on the side surfaces of the n-type polysilicon film patterns 314a and 315a and the p-type polysilicon film pattern 315b.

Next, a third photoresist film pattern 343 is formed. This photoresist film pattern 343 has an aperture at a part above the surface of the p-type well 302, covers the above-noted n-type polysilicon film pattern 314a, and minimally covers the n-type well 303 surface. This photoresist film pattern 343 is used as a mask to perform ion implantation of arsenic to approximately $5 \times 10^{15}$ cm$^{-2}$, so that the n-type polysilicon film pattern 315a becomes an n$^+$-type polysilicon film pattern 315aa and an n$^+$-type source/drain diffusion layer 324a is formed, self-aligned to the n$^+$-type polysilicon film pattern 315aa and the insulation spacer 322. The depth of the junction of the n$^+$-type source/drain diffusion layer 324a is, for example, approximately 0.10 µm and less (FIG. 14(c) and FIG. 16(c)).

Next, after removal of the photoresist film pattern 343, a fourth photoresist film pattern 344 is formed. This photoresist film pattern 344 has an aperture over the surface of the n-type well 303, minimally covers the p-type well 302 surface, and further has a plurality of apertures in parts that cove the n-type polysilicon film pattern 314a. The aperture width and spacing of the apertures in the part that covers the n-type polysilicon film pattern 314a, except for the end part of the n-type polysilicon film pattern 314a) are approximately 0.4 µm and 0.6 µm, respectively. The photoresist film pattern 344 is used as a mask to perform ion implantation of boron to approximately $5 \times 10^{15}$ cm$^{-2}$ using, for example, an energy of 2 keV, so that the above-noted p-type polysilicon film pattern 315b becomes a p$^+$-type polysilicon film pattern 315ba, a p$^+$-type source/drain diffusion region 324b being formed on the surface of the n-type well 303, self-aligned to the p$^+$-type polysilicon film pattern 315ba and the insulation film spacer 322. Simultaneously with this, a p$^+$-type region 317b is formed on the n-type polysilicon film pattern 314a. The depth of the junction of the p$^+$-type source/drain diffusion region 324b is, for example, approximately 0.15 µm, and the lengths of the n-type region 319a and p$^+$-type region 317b are each approximately 0.5 µm (FIG. 14(d) and FIG. 16(d)).

In this embodiment as well, there is no restriction with respect to the sequence of the process steps related to the photoresist film patterns 343 and 344, which can be reversed.

Figure 15A:
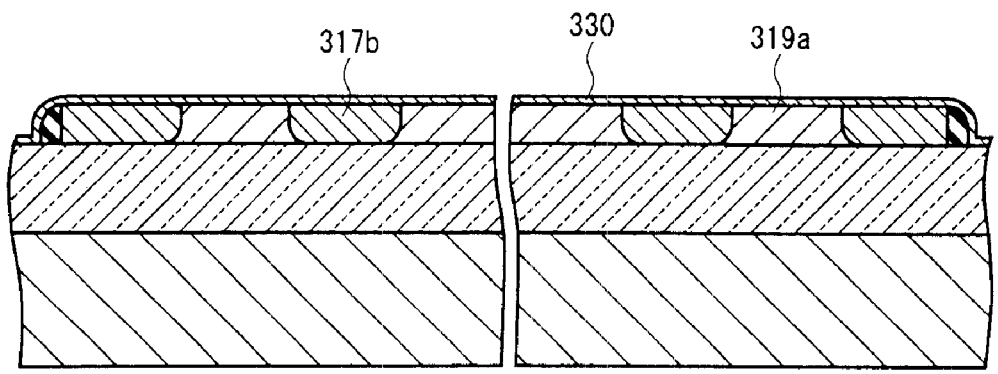
FIG. 15(a) to FIG. 15(c) are schematic cross-sectional views showing the manufacturing processes for a high-melting point metal silicide film missing part detection element according to the fourth embodiment of the present invention.
Figure 15B:
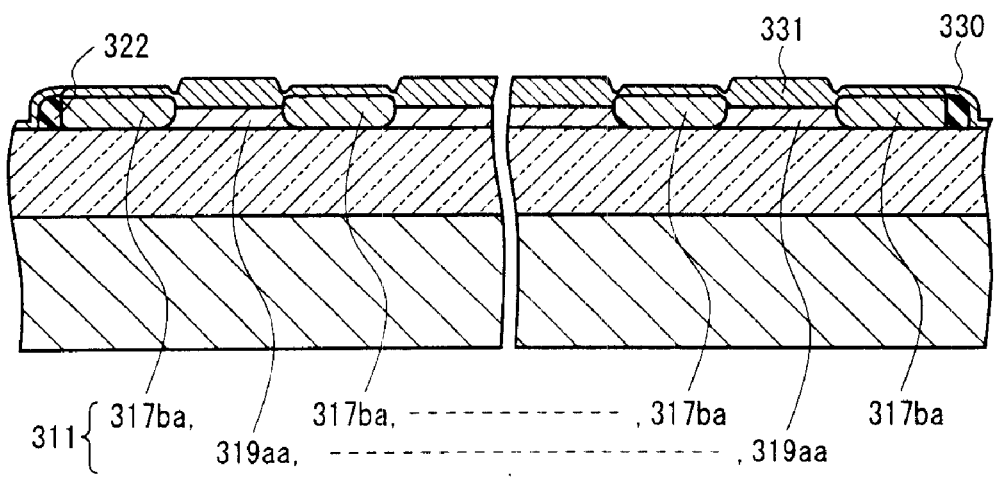
Figure 17A:
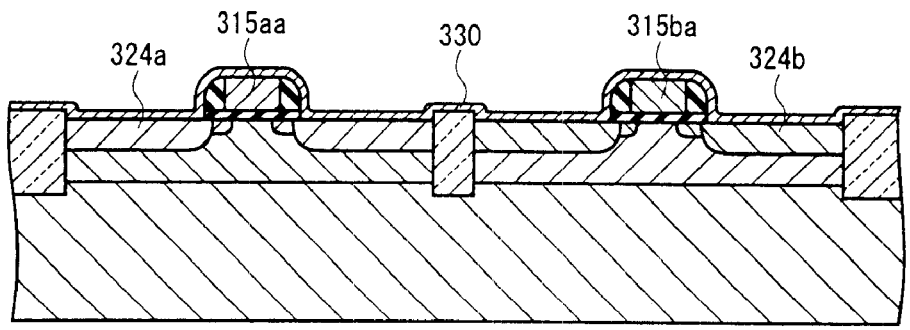
FIG. 17(a) to FIG. 17(c) are is schematic cross-sectional views showing the manufacturing processes for a CMOS transistor according to the fourth embodiment of the present invention.
Figure 17B:
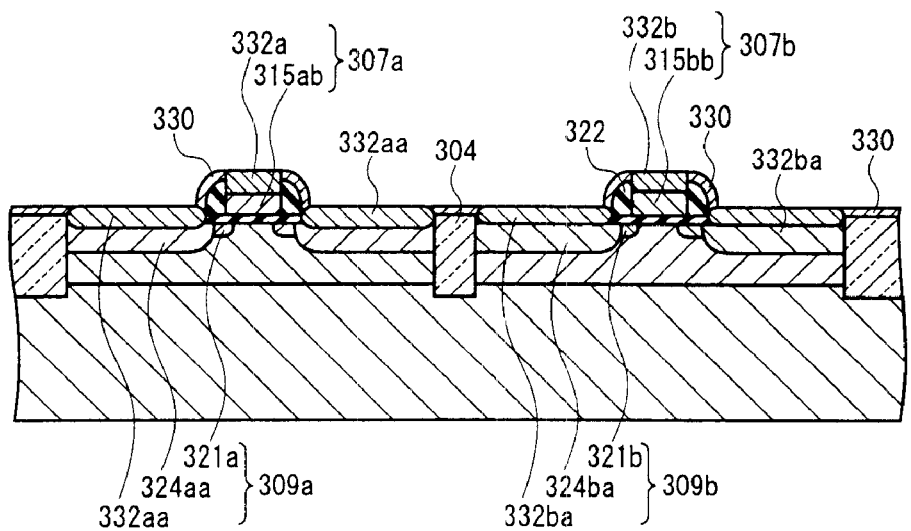

Next, after removing the above-noted photoresist film pattern 344, a cobalt film 330 is formed over the entire surface by, for example, a sputtering process (FIG. 15(a) and FIG. 17(a)).

Next, a siliciding reaction is caused at a temperature of, for example, 900° C. By doing this, in the part that becomes the high-melting-point metal silicide film missing part detection element, the n-type region 319a and p$^+$-type region 317b become an n-type region 319aa and p$^+$-type region 317ba, the original undoped polysilicon film pattern for the high-melting-point-metal silicide film missing part detection element becoming a polysilicon film pattern 311 in which there is alternating connection between the n-type region 319aa and the p$^+$-type region 317ba, a cobalt silicide film pattern 331 being formed on the surface of the polysilicon film pattern 311, in a self-aligned manner.

In the part that becomes the n-channel MOS transistor, the above-noted n$^+$ type polysilicon film pattern 315aa becomes an n$^+$-type polysilicon film pattern 315ab, and a cobalt silicide film pattern 332a is formed on the surface of the n$^+$-type polysilicon film pattern 315ab, in a self-aligned manner, thereby forming a gate electrode 307a by these laminated semiconductor layers. Simultaneously with this, the above-noted n$^+$-type source/drain diffusion layer 324a becomes an n$^+$-type source/drain diffusion layer 324aa, and a cobalt silicide film 332aa formed on the n$^+$-type source/ drain diffusion layer 324aa, in a self-aligning manner, thereby forming a source/drain region 309a formed by an n-type source/drain extension diffusion layer 321a, an n$^+$-type source/drain diffusion layer 324aa, and a cobalt silicide film 332aa.

In the part that becomes the p-channel MOS transistor, the above-noted p$^+$-type polysilicon film pattern 315ba becomes an n$^+$-type polysilicon film pattern 315bb and a cobalt silicide film pattern 332b is formed on the surface of the p⁺-type polysilicon film pattern 315bb in a self-aligned manner, these laminated semiconductor films forming a gate electrode 307b. Simultaneously with this, the above-noted p⁺-type source/drain diffusion layer 324b becomes a p⁺-type source/drain diffusion layer 324ba, and a cobalt silicide film 332ba formed on the p⁺-type source/drain diffusion layer 324ba, in a self-aligned manner, thereby forming a source/drain region 309b by the p-type source/drain extension diffusion layer 321b, the p⁺-type source/drain diffusion layer 324ba, and the cobalt silicide layer 332ba (FIG. 15(a), FIG. 17(b)).

Figure 15C:
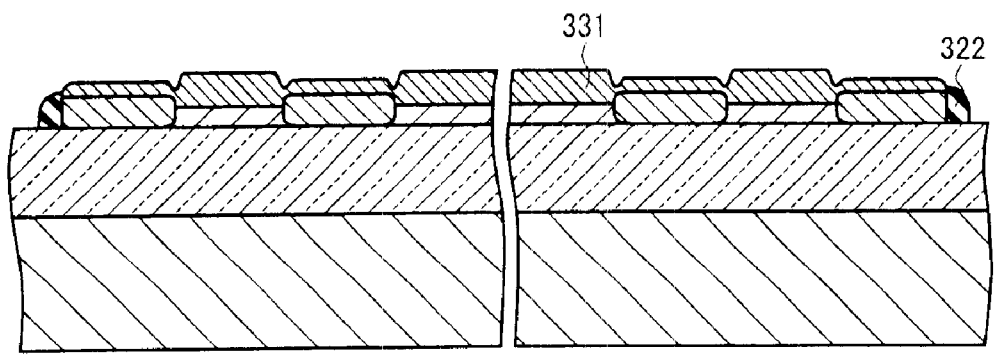
Figure 16A:
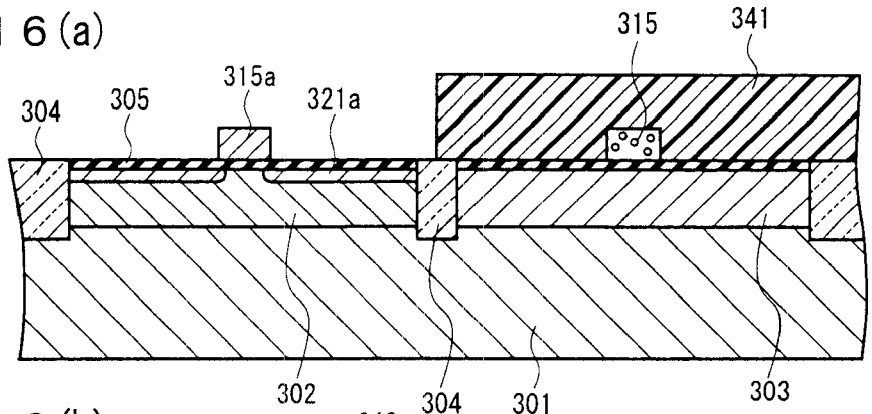
FIG. 16(a) to FIG. 16(d) are is schematic cross-sectional views showing the manufacturing processes for a CMOS transistor according to the fourth embodiment of the present invention.
Figure 16B:
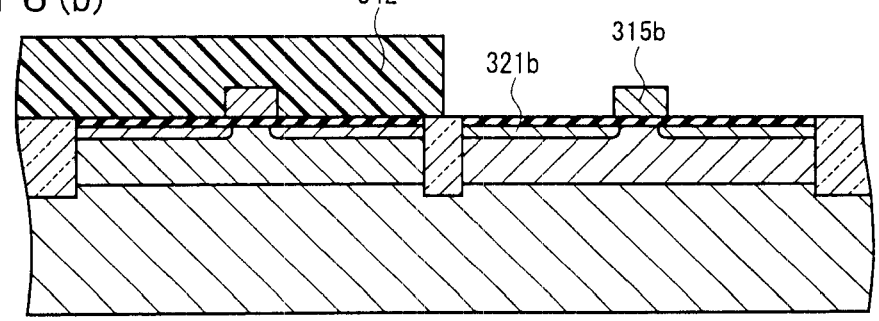
Figure 16C:
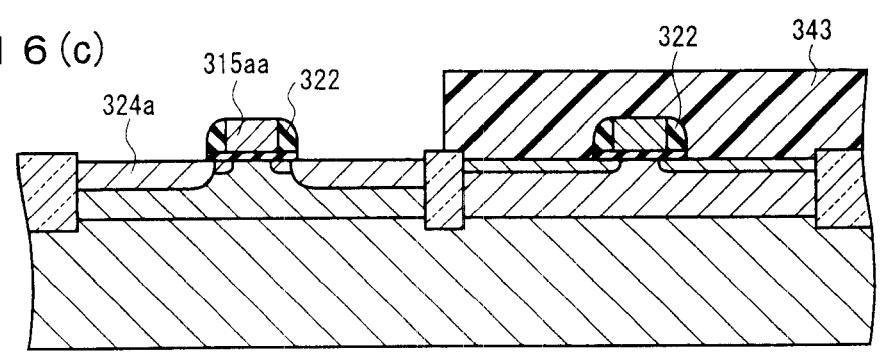
Figure 16D:
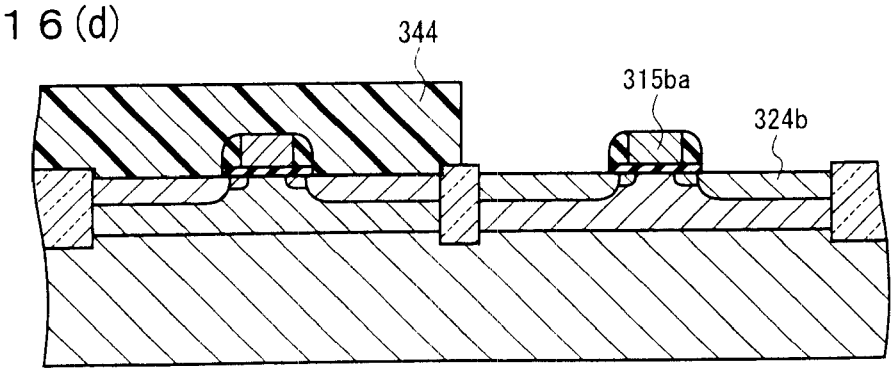
Figure 17C:
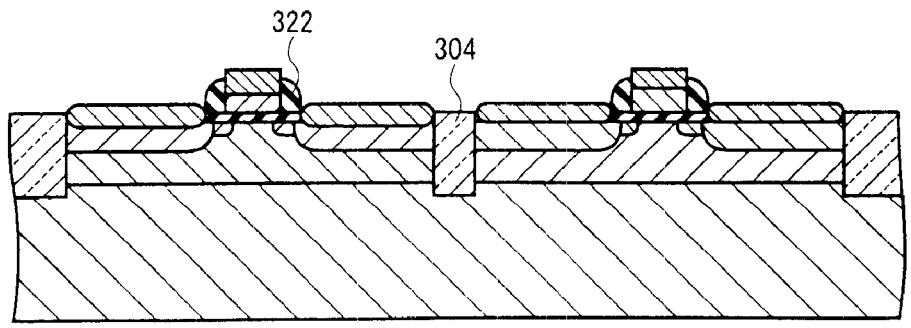

Next, an unreacted titanium film 330 that directly covers the surfaces of the field insulation film 304 and the insulation film spacer 322 is selectively removed (FIG. 15(c) and FIG. 17(c)).

After the above, an interlayer insulation film 335 formed by a silicon oxide insulation film is formed over the entire surface, and a contact hole is formed in this interlayer insulation film. Additionally, metal interconnects 338, 339a, 339b, and 339c are formed on the surface of the interlayer insulation film 335, thereby completing the semiconductor device of the fourth embodiment (FIG. 13(a) and FIG. 13(b)).

Although the above-described fourth embodiment relates to a semiconductor device having a cobalt salicide structure, the fourth embodiment is not restricted in this manner, and can be applied as well to other high-melting-point metal salicide, in which the film thickness of the high-melting point metal silicide film directly above the p⁺-type region being thinner than the film thickness of the high-melting point metal silicide film directly above the n-type region. It will also be understood that the above-noted embodiment of the fourth embodiment, although described with regard to various specific values, is not restricted to those values.

As described in detail above, a polysilicon film pattern made up of a high-melting point metal silicide film missing part detection element according to the present invention is formed by alternate connections of either n⁺-type and p⁺-type regions, n⁺-type and p-type regions, or n-type and p⁺-type regions. By doing this, a film thickness in a part that is directly above the n⁺-type region or n-type region is different from the film thickness in a part that is directly above the p⁺-type region or p-type region.

As a result, there is a tendency for a missing part to occur in the high-melting point metal silicide film missing part detection element directly above the junction part between the n⁺-type region or n-type region and the p⁺-type region or p-type region, thereby facilitating fine detection formed in a gate electrode having a polycide structure.

What is claimed is:

1. A semiconductor device comprising an n-channel MOS transistor and a p-channel MOS transistor each having a salicide structure, and a high-melting point metal silicide film missing part detection element detecting a missing part formed in a high-melting point metal silicide film provided on a gate electrode of said MOS transistors, wherein said high-melting point metal silicide film missing part detection element comprising a polysilicon film pattern with alternate connection between an n-type region having a prescribed impurity concentration and a p-type region having a prescribed impurity concentration, and a high-melting point metal silicide film formed on said polysilicon film pattern.

2. A semiconductor device according to claim 1, said impurity concentration of said p-type region is higher than that of said n-type region.

3. A semiconductor device according to claim 2, both ends of said polysilicon film pattern are made of said p-type region.

4. A semiconductor device according to claim 1, said impurity concentration of said n-type region is higher than that of said p-type region.

5. A semiconductor device according to claim 4, both ends of said polysilicon film pattern are made of said n-type region.

6. A semiconductor device according to claim 1, a source/drain region of said MOS transistor is formed by a LDD region and a source/drain diffusion layer having an impurity concentration higher than that of said LDD region, an impurity concentration of n-type region of said high-melting point metal silicide film missing part detection element is equal to that of said source/drain diffusion layer of said n-channel MOS transistor, and an impurity concentration of p-type region of said high-melting point metal silicide film missing part detection element is equal to that of said source/drain diffusion layer of said p-channel MOS transistor.

7. A semiconductor device according to claim 1, a source/drain region of said MOS transistor is formed by a LDD region and a source/drain diffusion layer having an impurity concentration higher than that of said LDD region, an impurity concentration of n-type region of said high-melting point metal silicide film missing part detection element is equal to that of said LDD region of said n-channel MOS transistor.

8. A semiconductor device according to claim 1, a source/drain region of said MOS transistor is formed by a LDD region and a source/drain diffusion layer having an impurity concentration higher than that of said LDD region, an impurity concentration of p-type region of said high-melting point metal silicide film missing part detection element is equal to that of said LDD region of said p-channel MOS transistor.

9. A semiconductor device according to claim 1, minimum line width of said polysilicon film pattern of said high-melting point metal silicide film missing part detection element is equal to a gate length of a gate electrode of said MOS transistor.

10. A semiconductor device according to claim 1, said high-melting point metal is either one of titanium or cobalt.

* * * * *